United States Patent [19]

Takada et al.

[11] Patent Number: 4,973,833
[45] Date of Patent: Nov. 27, 1990

[54] IMAGE SENSOR INCLUDING LOGARITHMIC CONVERTERS

[75] Inventors: Kenji Takada; Jun Hasegawa; Shigehiro Miyatake, all of Osaka, Japan

[73] Assignee: Minolta Camera Kabushiki Kaisha, Osaka, Japan

[21] Appl. No.: 413,535

[22] Filed: Sep. 27, 1989

[30] Foreign Application Priority Data

Sep. 28, 1988 [JP] Japan ................................ 63-242953
Dec. 13, 1988 [JP] Japan ................................ 63-314730
Sep. 18, 1989 [JP] Japan ................................ 1-242709

[51] Int. Cl.$^5$ ............................................. H01J 40/14
[52] U.S. Cl. ............................... 250/208.1; 250/214 L
[58] Field of Search ................ 250/208.1, 214 L, 475; 356/223; 358/213.11–213.31

[56] References Cited

U.S. PATENT DOCUMENTS

| | | |
|---|---|---|
| 3,574,443 | 4/1971 | Nanba . |
| 3,781,119 | 12/1973 | Mori ..................................... 356/223 |
| 3,829,865 | 8/1974 | Kamasako ........................... 356/223 |
| 3,902,812 | 9/1975 | Honkawa ............................. 356/223 |
| 4,473,836 | 9/1984 | Chamberlain . |
| 4,584,606 | 4/1986 | Nagasaki . |
| 4,598,414 | 7/1986 | Dries et al. . |
| 4,742,238 | 5/1988 | Sato . |

Primary Examiner—David C. Nelms
Assistant Examiner—Que Tan Le
Attorney, Agent, or Firm—Price, Gess & Ubell

[57] ABSTRACT

A photosensor, or an image sensor made of many such photosensors, including a plurality of photosensor pixels each having a logarithmic converter. The logarithmic converter converts source charges that are produced by a photoreceptor (or a photodiode) and proportional to the amount of the incident light into signal charges logarithmically proportional to the source charges whose amount does not grow so rapid as the amount of source charges grows. Owing to the logarithmic converter, the dynamic range of the photosensor (or image sensor) has a very wide dynamic range.

6 Claims, 36 Drawing Sheets

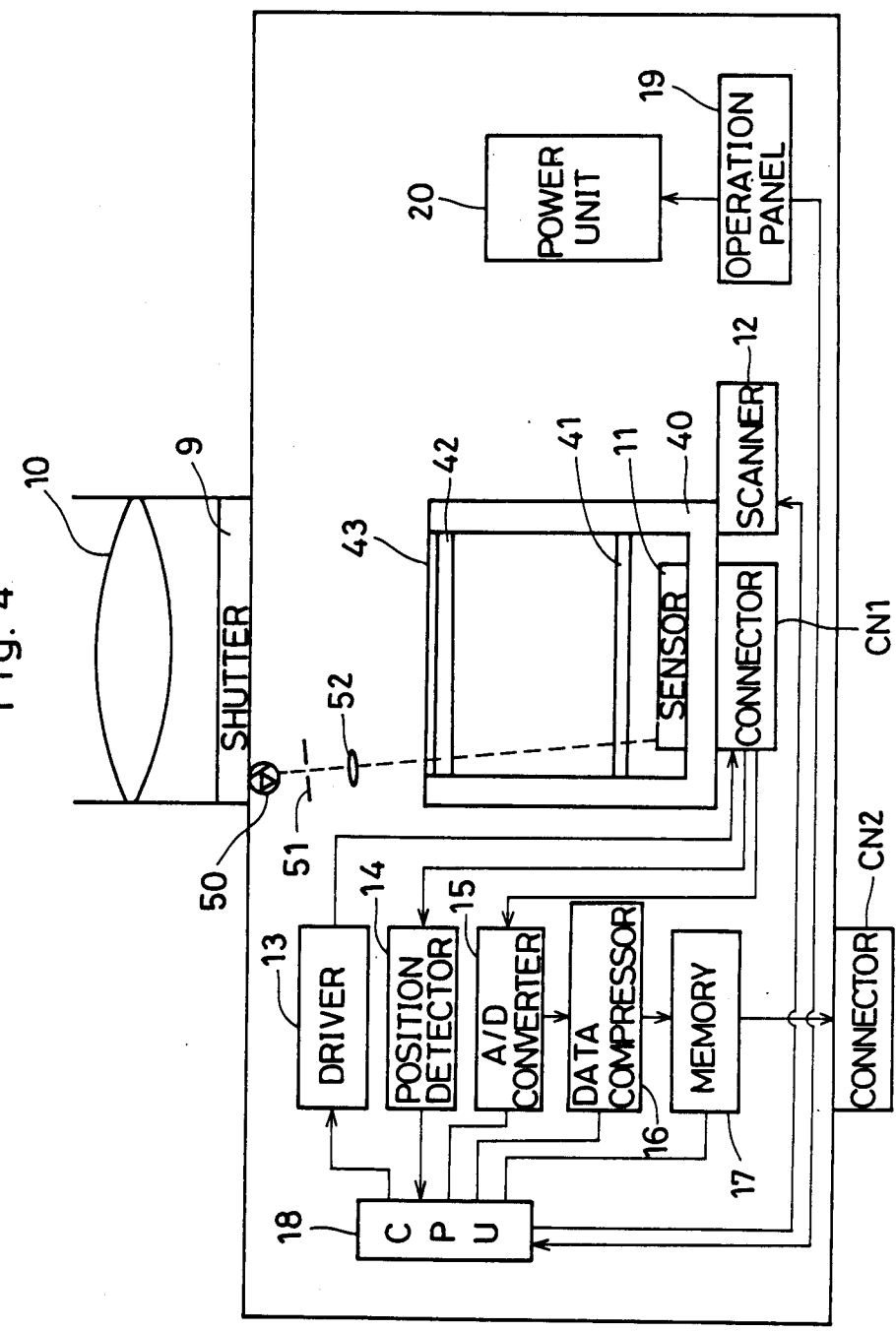

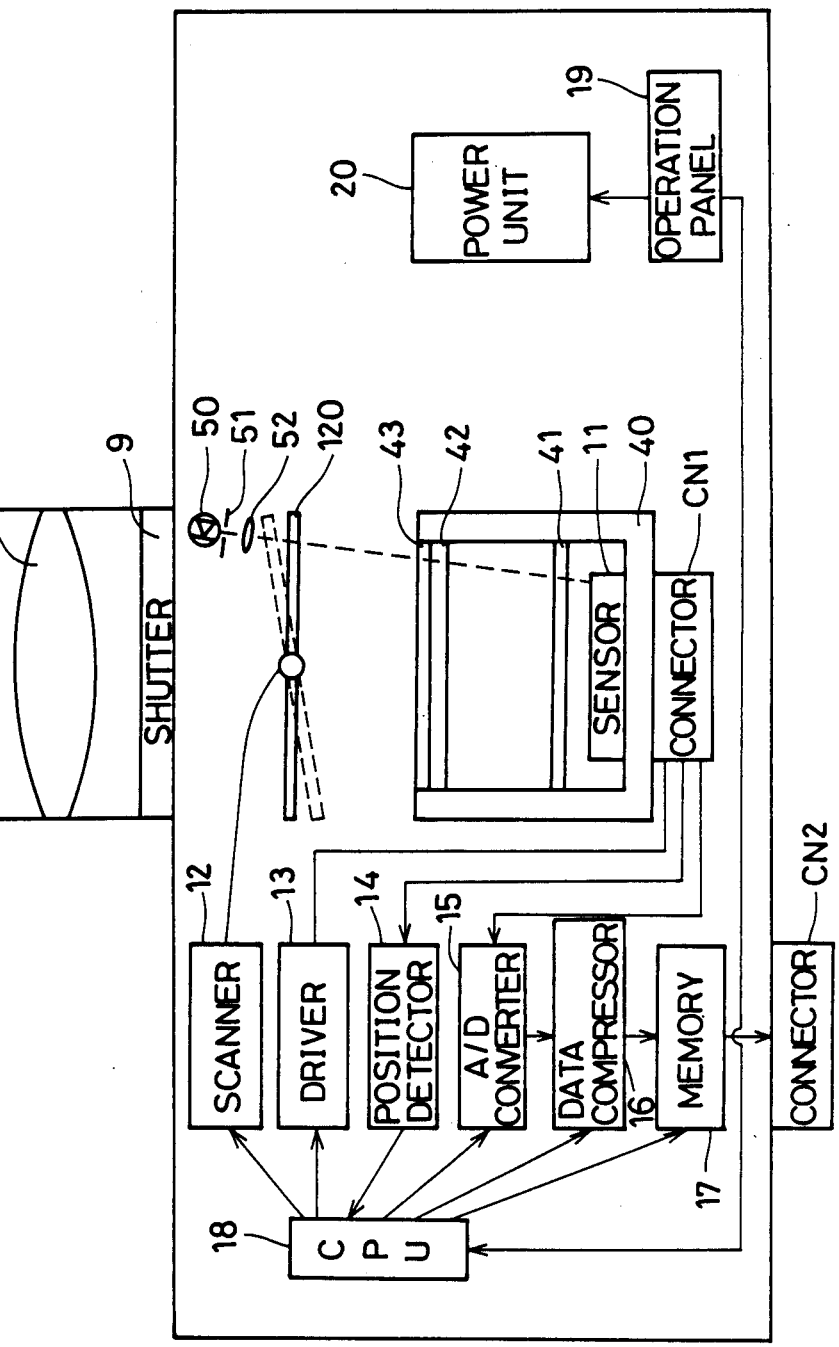

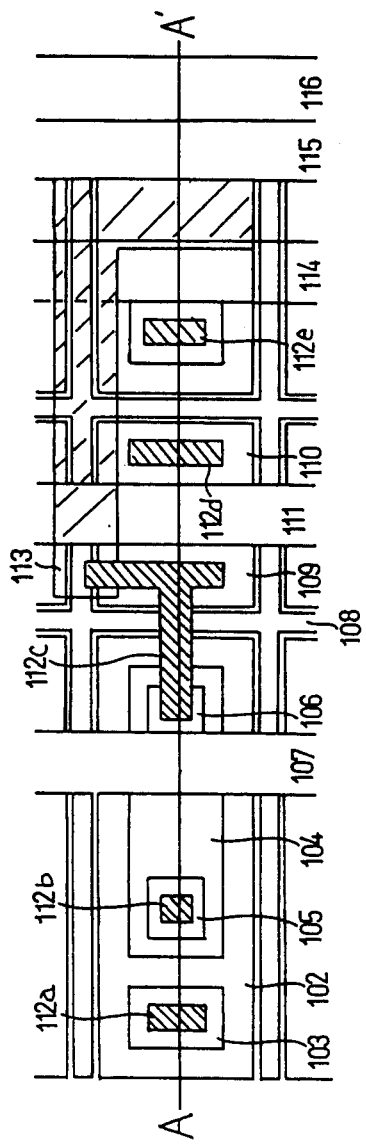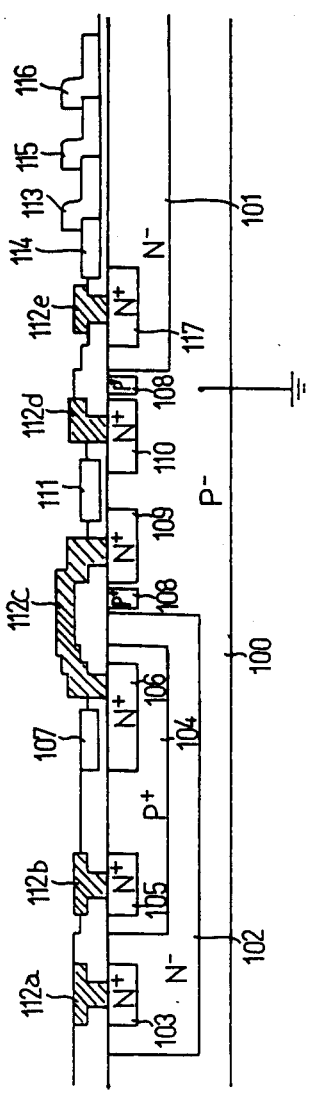
Fig.16(a)
Fig.16(b)

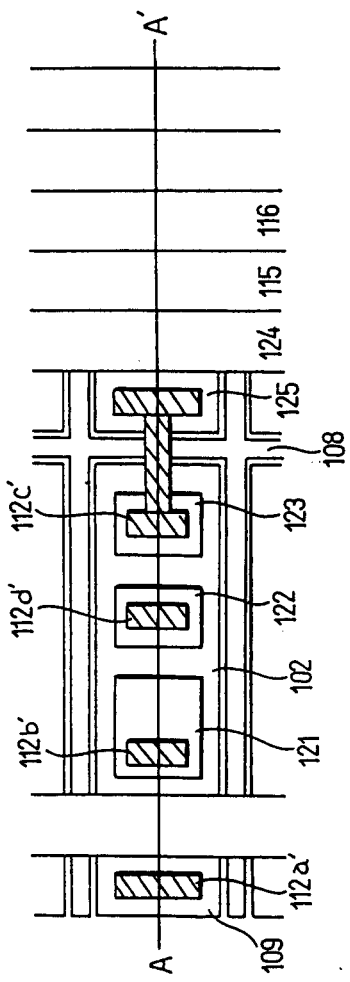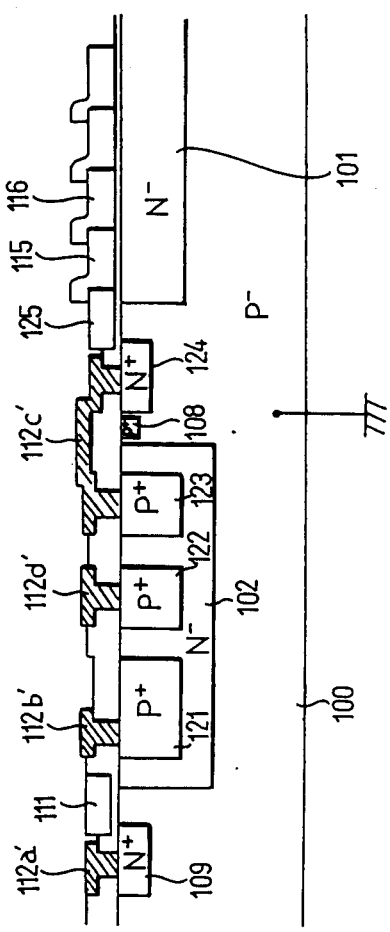
Fig.17(a)
Fig.17(b)

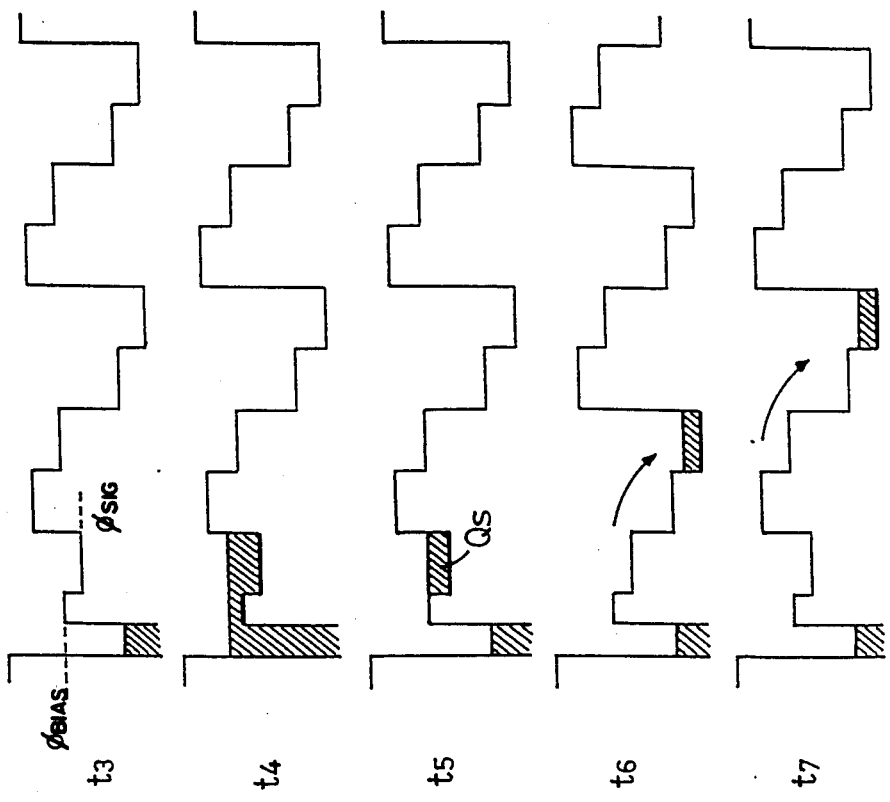

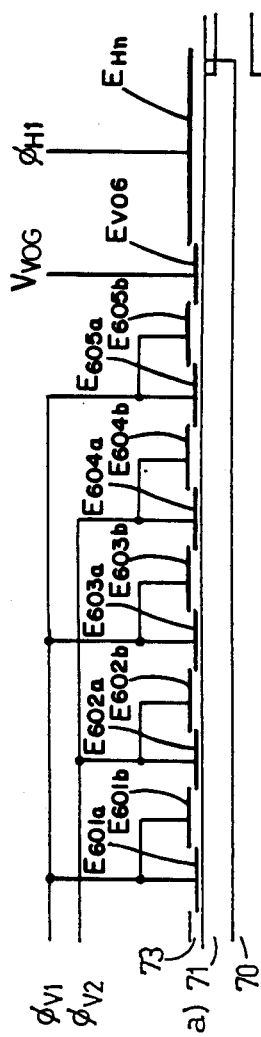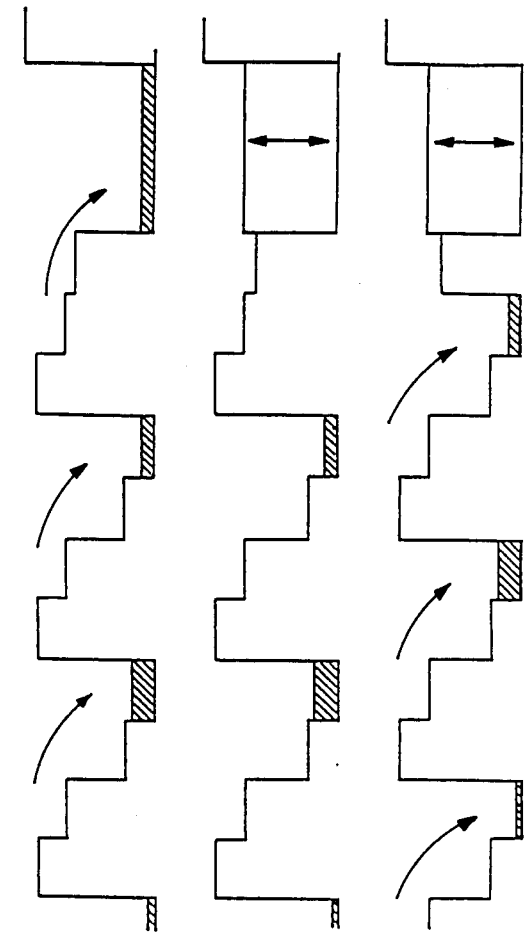
Fig.20(a) Fig.20(b) Fig.20(c) Fig.20(d) Fig.20(e)

Fig.22(a)
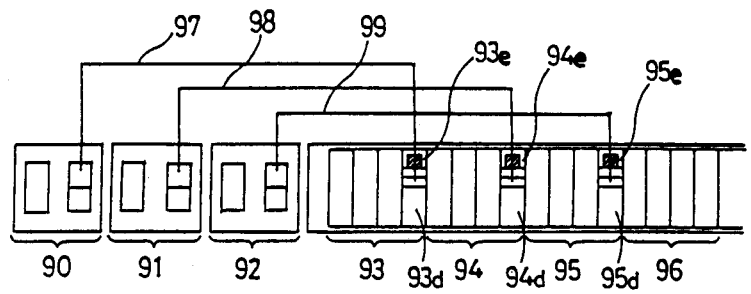
Fig.22(b)
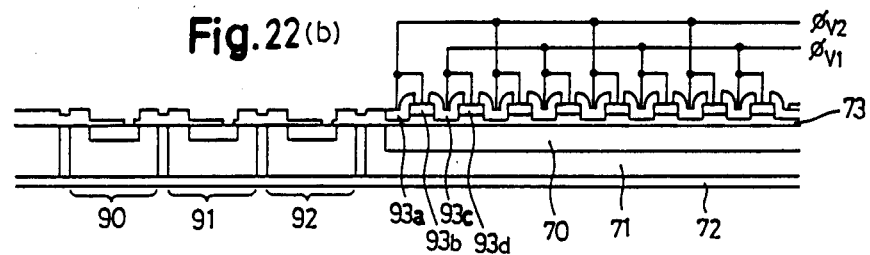
Fig.22(c) t₁
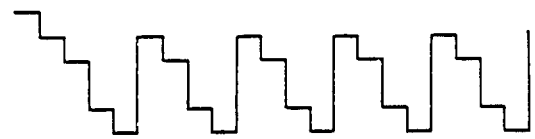
Fig.22(d) t₂
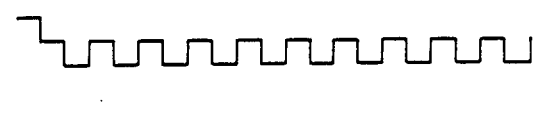
Fig.22(e) t₅
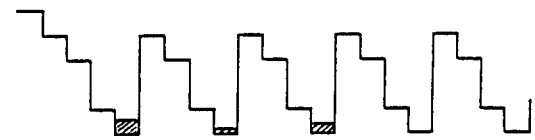
Fig.22(f) t₁'
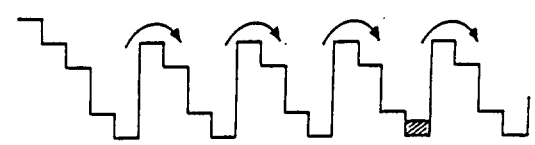
Fig.22(g) t₂'

Fig. 23 (c) $t_2$ 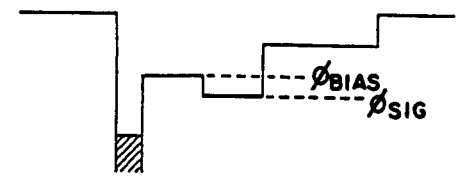
Fig. 23 (d) $t_3$ 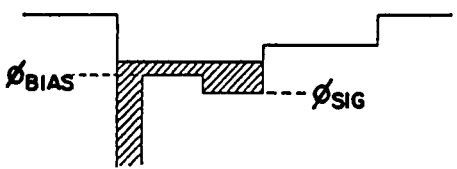
Fig. 23 (e) $t_4$ 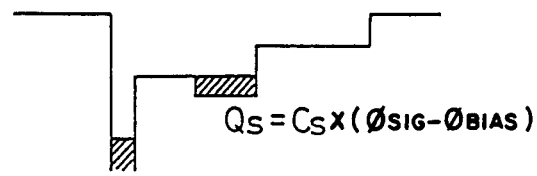
Fig. 23 (f) $t_5$ 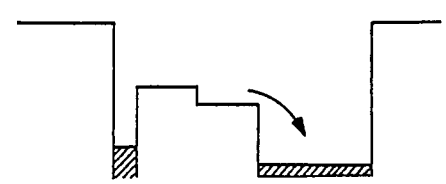

Fig. 25(a)
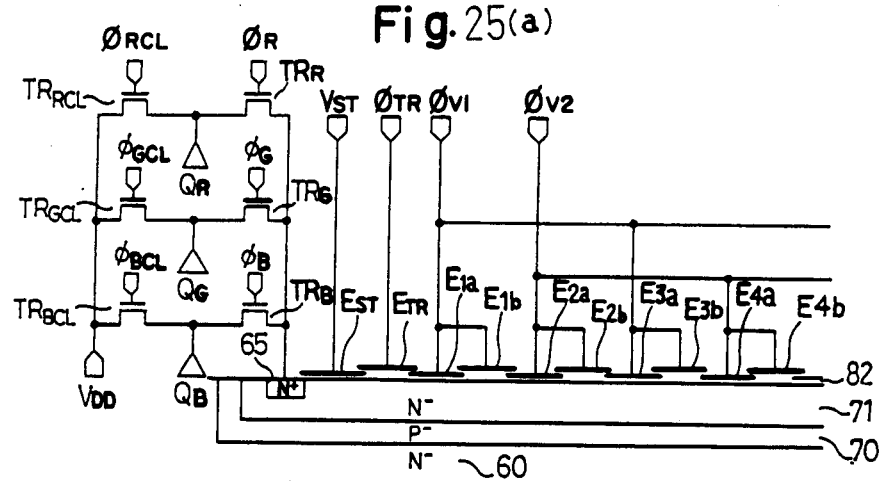
Fig. 25(b) t
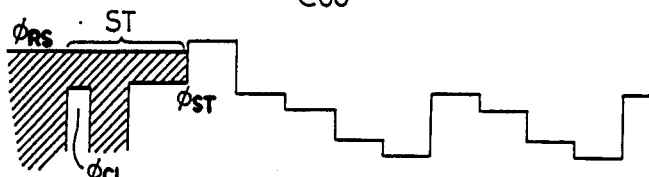
Fig. 25(c) t
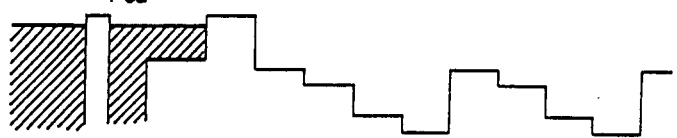
Fig. 25(d) t
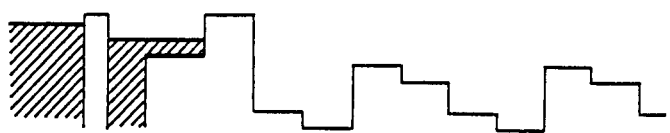
Fig. 25(e) t
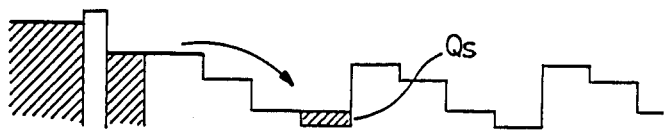
Fig. 25(f) t
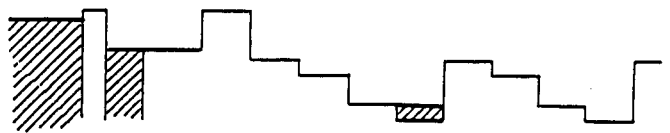

Fig. 27(a)
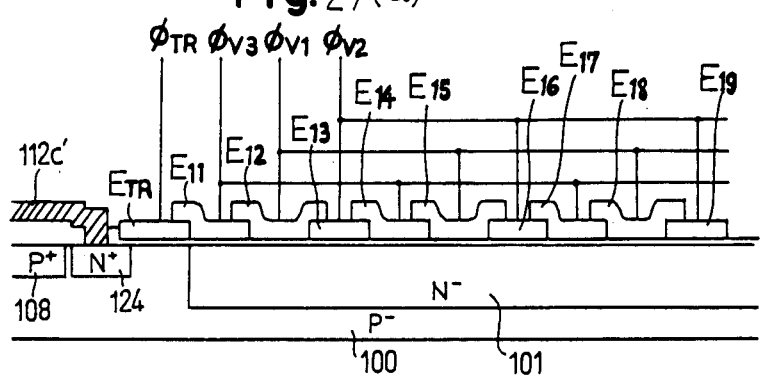
Fig. 27(b) t₁
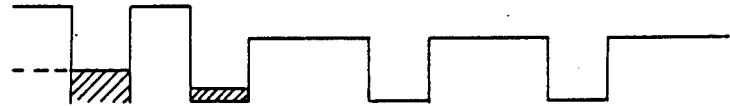
Fig. 27(c) t₂
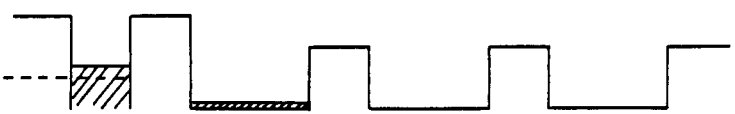
Fig. 27(d) t₃
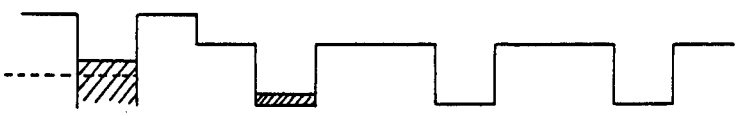
Fig. 27(e) t₄
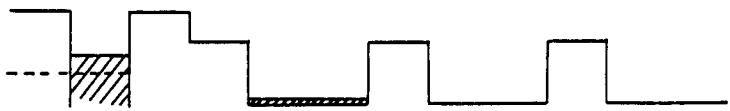
Fig. 27(f) t₅
Fig. 27(g) t₆
Fig. 27(h) t₇

Fig. 29 (a)
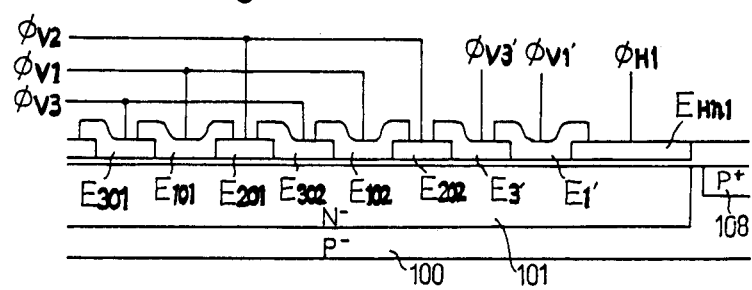
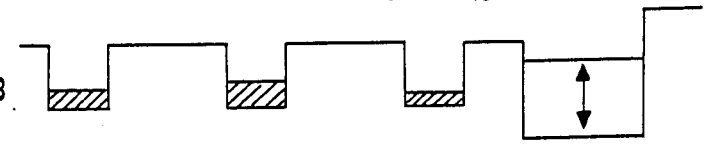
Fig. 29 (b) t8
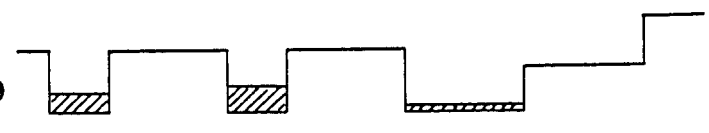
Fig. 29 (c) t9
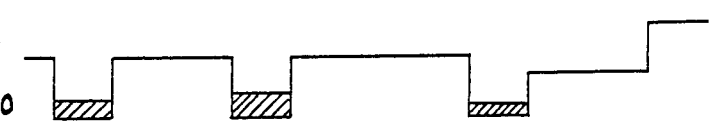
Fig. 29 (d) t10
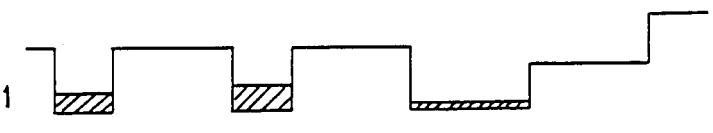
Fig. 29 (e) t11
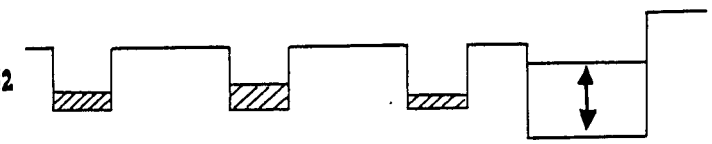
Fig. 29 (f) t12
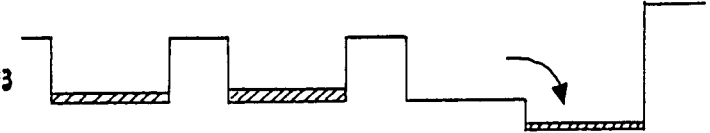
Fig. 29 (g) t13
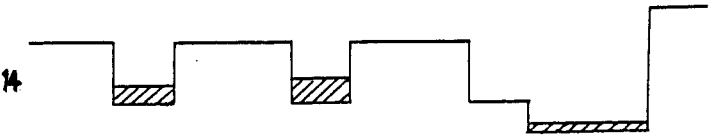
Fig. 29 (h) t14

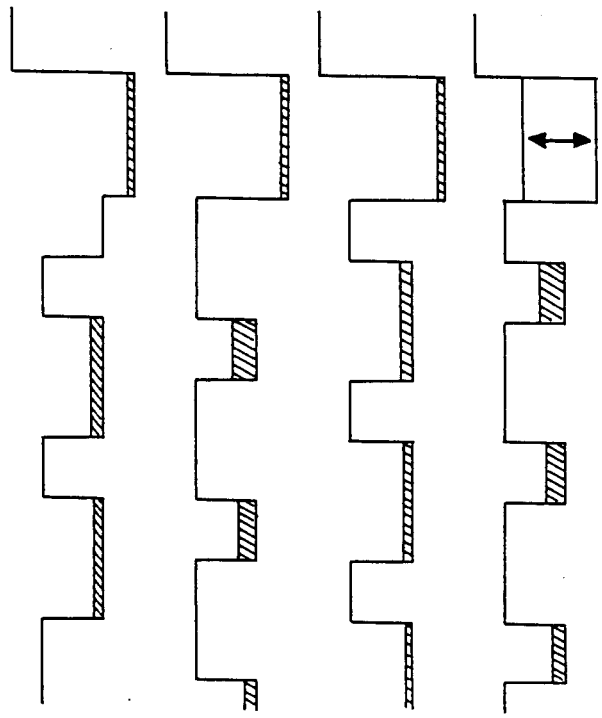
Fig. 29(i) t₁₅
Fig. 29(j) t₁₆
Fig. 29(k) t₁₇
Fig. 29(ℓ) t₁₈

Fig. 30(a)
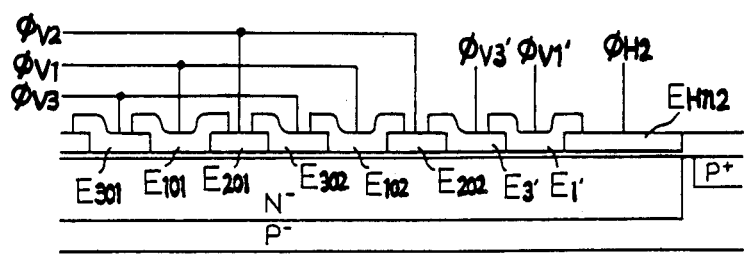
Fig. 30(b) t8
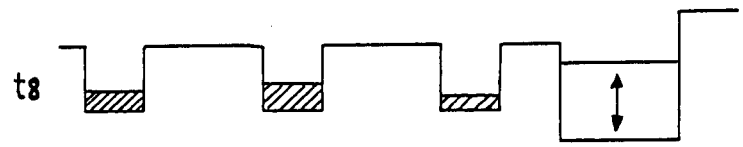
Fig. 30(c) t9
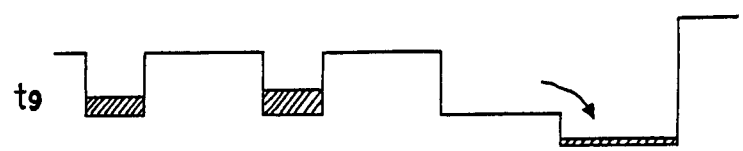
Fig. 30(d) t10
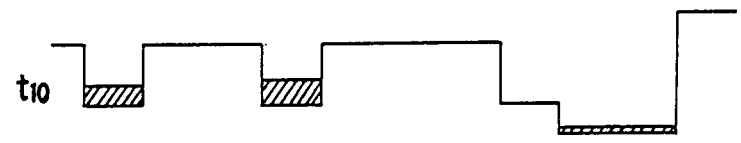
Fig. 30(e) t11
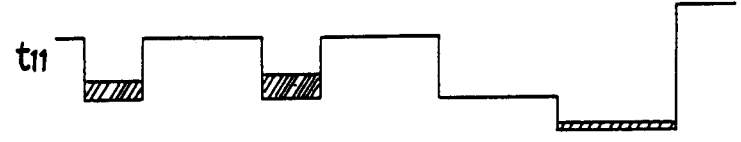
Fig. 30(f) t12
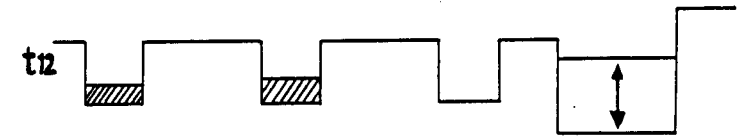
Fig. 30(g) t13
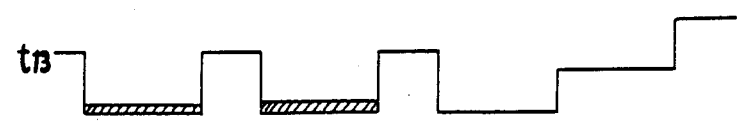
Fig. 30(h) t14
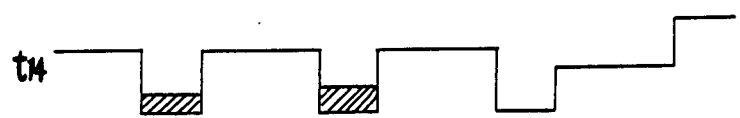

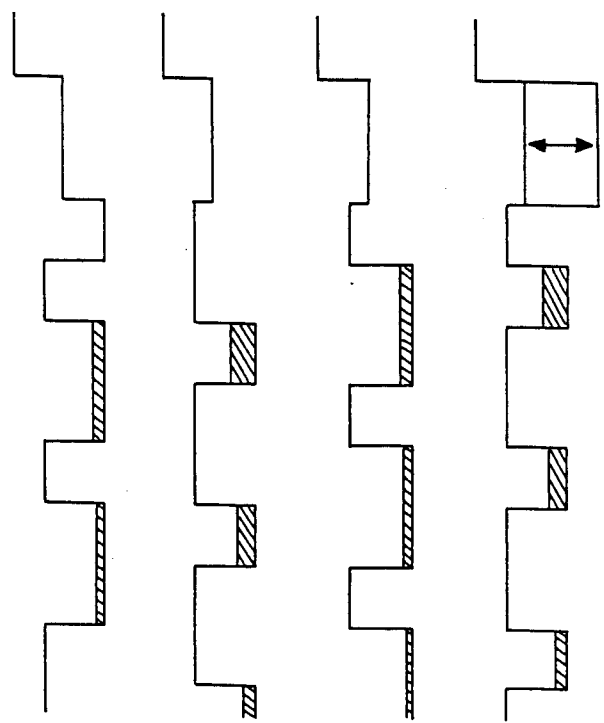
Fig. 30 (i)  Fig. 30 (j)  Fig. 30 (k)  Fig. 30 (ℓ)

IMAGE SENSOR INCLUDING LOGARITHMIC CONVERTERS

The present invention relates to an image sensor including a plurality of solid-state photosensors, and particularly a photosensor, for sensing from very feeble light to very strong light, i.e., having a wide dynamic range.

BACKGROUND

Changing the photoelectric conversion time (or change accumulation time) is the most common method to expand the dynamic range of a solid state image sensor. When the incoming light is strong, the charge accumulation time is shortened, and when the light is weak, the accumulation time (or the exposure time) is extended. However, when a picture including both a bright area (highlight) and a dark area (shadow) is to be taken by an image sensor, the proper accumulation time differs in those areas. When the accumulation time is adjusted for the highlight, the image data in the shadow cannot be obtained, and when the accumulation time is adjusted for the shadow, the photosensors in the highlight area saturate (i.e. the image data is all white or the photosensors will be destroyed). The solution to this problem is to expand the dynamic range of every pixel photosensor constituting the image sensor.

One of the measures for expanding the dynamic range of a solid state photosensor is described in the Japanese Patent Laid-open No. S6281183 where the voltage applied on the exit gate electrode of the charge storage is changed stepwise.

SUMMARY OF THE INVENTION

The object of the present invention is to provide a solid state photosensor having a very wide dynamic range using a simple and novel structure of the photosensor.

Another object of the present invention is to provide an image sensor using such photosensors as the pixels.

To achieve this and other objects, a photosensor constituting an image sensor according to the present invention includes:

a photoreceptor for receiving light and generating source electrical charges corresponding to the amount of the received light; and a logarithmic converter for receiving the source electrical charges and for generating signal electrical charges whose amount is logarithmically proportional to the source electrical charges.

The image sensor and photosensor of the present invention further include other features which are described below in the description of the preferred embodiment referring to the attached drawings.

BRIEF EXPLANATION OF THE DRAWINGS

FIG. 4 is a construction diagram of an example of the image input section of the image recorder.

FIG. 5 is a construction diagram of another example of the image input section of the image input device.

FIG. 11(a) is the plan view and FIGS. 11(b), 11(c) and 11(d) are cross-sectional views along the lines B—B', C—C' and D—D' respectively in FIG. 11(a).

FIGS. 13(b), 13(c) and 13(d) are cross-sectional views along the lines B—B', C—C' and D—D' respectively in FIG. 13(a).

FIG. 16(a) is a plan view and FIG. 16(b) is a cross-sectional view along the line A—A' of an example of the photoelectric converter shown in FIG. 8(c).

FIG. 17(a) is a plan view and FIG. 17(b) is a cross-sectional view along the line A—A' of an example of the photoelectric converter shown in FIG. 8(e).

FIGS. 18(b) through 18(f) are potential diagrams corresponding to times $t_3$ through $t_7$ of FIG. 19.

FIG. 20(a) shows a cross-sectional structure of the junction of a vertical CCD and a horizontal CCD of the image sensor, and FIGS. 20(b) through 20(e) are potential diagrams during charge transfer between them.

FIG. 22(a) is a plan view and FIG. 22(b) is a cross-sectional view of photoelectric converter and the corresponding vertical CCD, and FIGS. 22(c) through 22(g) are potential diagrams corresponding to times $t_3$ through $t_7$ of FIG. 24.

FIG. 25(a) shows a cross-sectional structure of the second example of the vertical CCD, and FIGS. 25(b) through 25(f) are potential diagrams corresponding to times $t_1$ through $t_5$ of FIG. 26.

FIG. 27(a) shows a cross-sectional structure of the third example of the vertical CCD, and FIGS. 27(b) through 27(h) are potential diagrams corresponding to times $t_1$ through $t_7$ of FIG. 28.

FIG. 29(a) shows a cross-sectional structure of another example of the junction of a vertical CCD and a horizontal CCD of the image sensor, and FIGS. 29(b) through 29(l) are potential diagrams during charge transfer between them.

FIG. 30(a) shows a cross-sectional structure of still another junction of a vertical CCD and a horizontal CCD of the image sensor, and FIGS. 30(b) through 30(l) are potential diagrams during charge transfer between them.

DETAILED DESCRIPTION OF PREFERRED EMBODIMENTS

Figure 3:
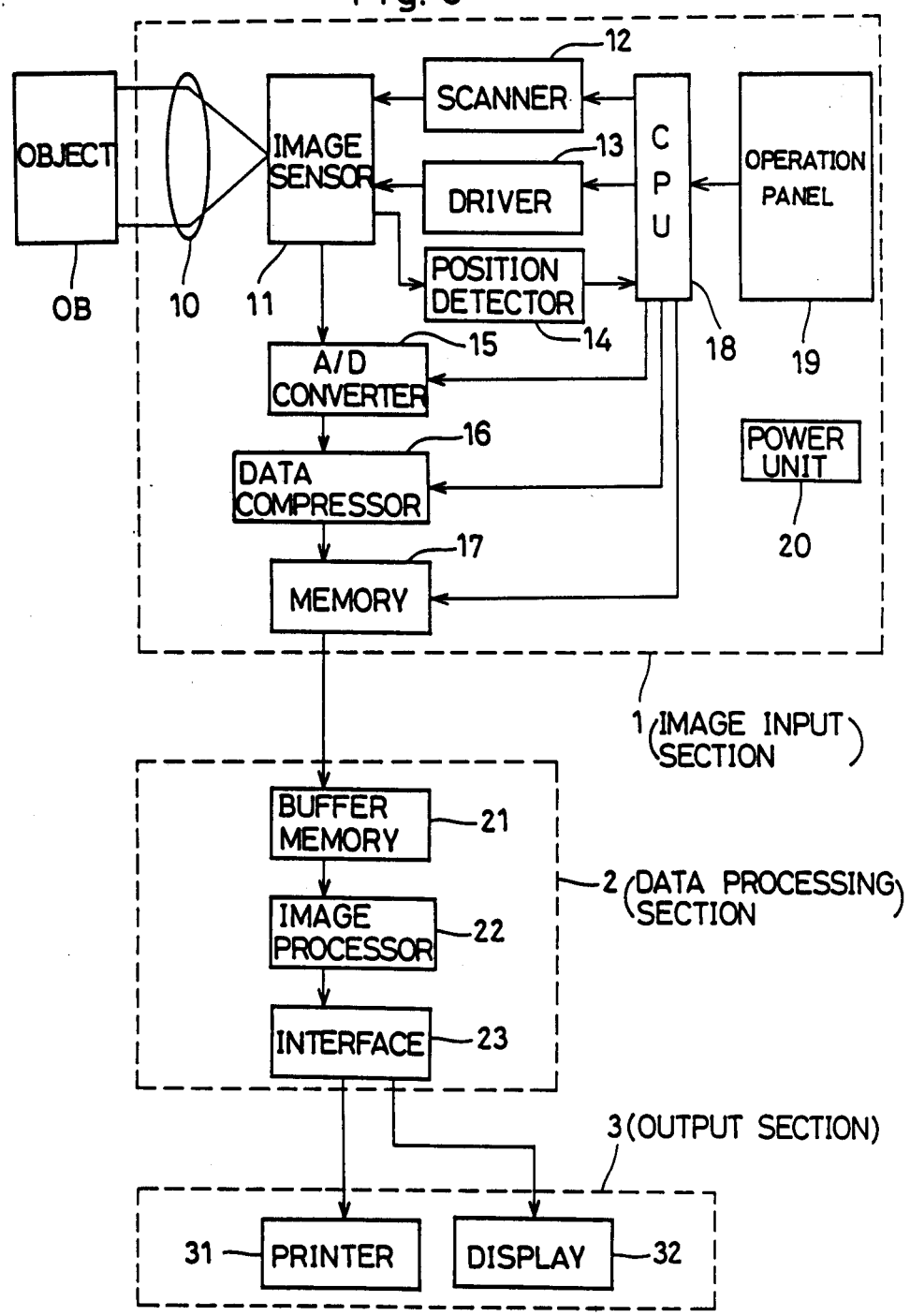
FIG. 3 is a construction diagram of an image recorder using the image sensor according to the present invention.

FIG. 3 shows an image recorder embodying the present invention. The image recorder is constructed from an image input section 1, a data processing section 2 and an output section 3.

The image input section 1 includes: an optical system 10 for projecting an image of the object OB on the image sensor 11; an image sensor 11 according to the present invention including the logarithmic converter; a scanner 12 for moving the object image or the image sensor 11; an electrical driver 13 for the image sensor 11; a scanning position detector 14 for detecting the relative position of the object image and the image sensor 11; an A/D converter 15; a data compressor 16; a data memory 17; a central processing unit (CPU) 18; an operation panel including a power switch, shutter release switch, and such; and a power supply unit 20.

The data processing section 2 includes: a buffer memory 21 for temporarily storing data from the image input section 1; an image processor 22 for performing various data processing on the image data; and an interface 23 for arranging the processed data into a predetermined format.

The output section 3 includes a printer 31, a display, etc.

The image recorder works as follows. When the power switch on the operation panel 19 is turned on, power is supplied from the power unit 20 to every part of the image recorder. Then, when the release switch on the operation panel 19 is pressed, the CPU 18 sends commands to the scanner 12, the driver 13, and the position detector 14, which operate synchronously to move the image sensor 11 or the object image. During the scanning movement, the object image is projected on the image sensor 11 by the optical system 10, and the image is decomposed into three primary colors, red (R), green (G) and blue (B), by the respective color filters. The three color components of the image are sensed by photodiodes under the respective color filters, and the amount of the incident color light is converted into proportional amount of electrical charges by the photodiodes. The electrical signal generated by a photodiode is logarithmically converted and is sent to the charge coupled device (CCD) of the image sensor 11 where it is temporarily held. When the image scanning is finished, the analogue signals held in the CCD are read out and converted into digital signals by the A/D converter 15 according to a command from the CPU 18. The digital signals are sent to the data compressor 16 to be compressed to the size of from 1/10 to 1/1000, and then stored in the data memory 17. The data memory 17 is made of a non-volatile electronic memory chip such as Electrically Erasable Programmable Read Only Memory ($E^2PROM$), or volatile memory chip with a backup battery. The position detector 14 detects the currently scanning position of the image sensor 11, whose detail is described later.

Image Input Section

FIGS. 4 and 5 show two examples of the structure of the input section 1, in which the numeral 40 denotes a package for containing the image sensor 11, numeral 41 is the first protection layer for the image sensor 11, numeral 42 is an infrared cutting filter, numeral 43 is the second protection layer, numeral 50 is a light source for the scanning-position detection such as a light emitting diode (LED) or a laser diode (LD), numeral 51 is an aperture stop, numeral 52 is the optical system for the scanning-position detection, and numeral 120 is a transparent rotating plate for image scanning.

The package 40 can be made of a pin grid array (PGA). Ordinary solid state image sensors have only one protection layer 41, but the image sensor 11 of the present embodiment has the second protection layer 43. Since the first protection layer 41 is placed close to the focal plane of the projected image, dusts fallen on the protection layer 41 directly make noises on the sensed image. The second protection layer 43 prevents the dusts at the higher, afocal position and thus eliminates the dust image from the sensed image. The infrared cutting filter 42 may be placed anywhere between the object and the image sensor 11. The infrared cutting filter 42 is provided because the three color filters for the image sensor 11 pass the infrared light, and the silicon photodiodes of the image sensor 11 are sensitive to the infrared light. It is desirable to place an ultraviolet cutting filter before the image sensor 11 to prevent the color filters from degenerating. The color filters contain organic colorants or pigments, and they are apt to fade by the ultraviolet light, which causes color shift in the sensed image. The shutter 9 is provided by the same reason. Since the image sensor 11 can change the exposure time by controlling the charge accumulation time, the mechanical shutter 9 is not necessary for controlling the exposure time. But by shutting the shutter 9 when not sensing the image, the color filters are prevented from harmful ultraviolet light irradiation. Of course, the ultraviolet filter or the shutter 9 is not an indispensable component of the embodiment.

The light source 50, aperture stop 51 and the optical system 52 are used to cast the scanning-position detection light onto a predetermined sensing portion. FIG. 4 shows the scanning mechanism that moves the image sensor 11, and FIG. 5 shows that moves the object image. In the former case, the image sensor 11 may be moved magnetically by a magnet and a coil, mechanically using a spring, or using a stepping motor, and so on. In the latter case, the transparent plate 120 is rotated between the object and the image sensor 11, or the optical system 10 is shifted. Many other known methods can be used to scan the object image on the image sensor 11.

Image Sensor

Figure 1A:
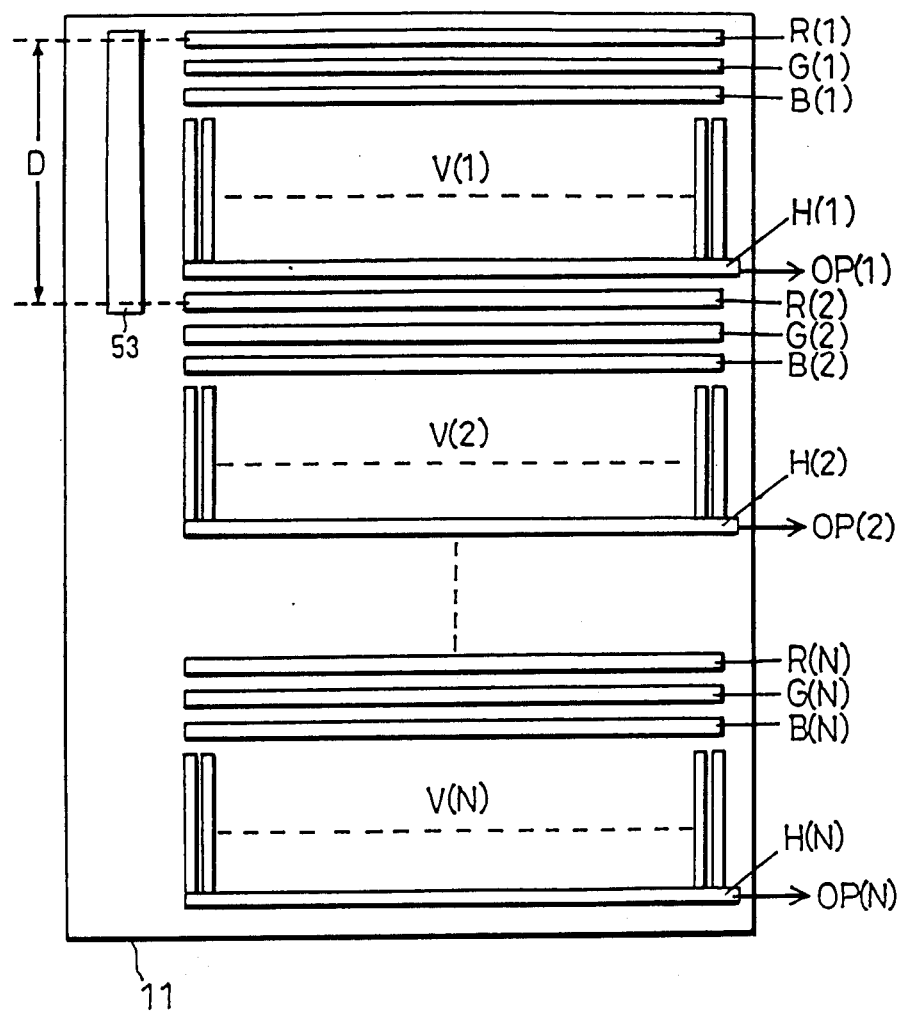
FIGS. 1(a) and 1(b) show two examples of the structure of the image sensor according to the present invention.
Figure 1B:
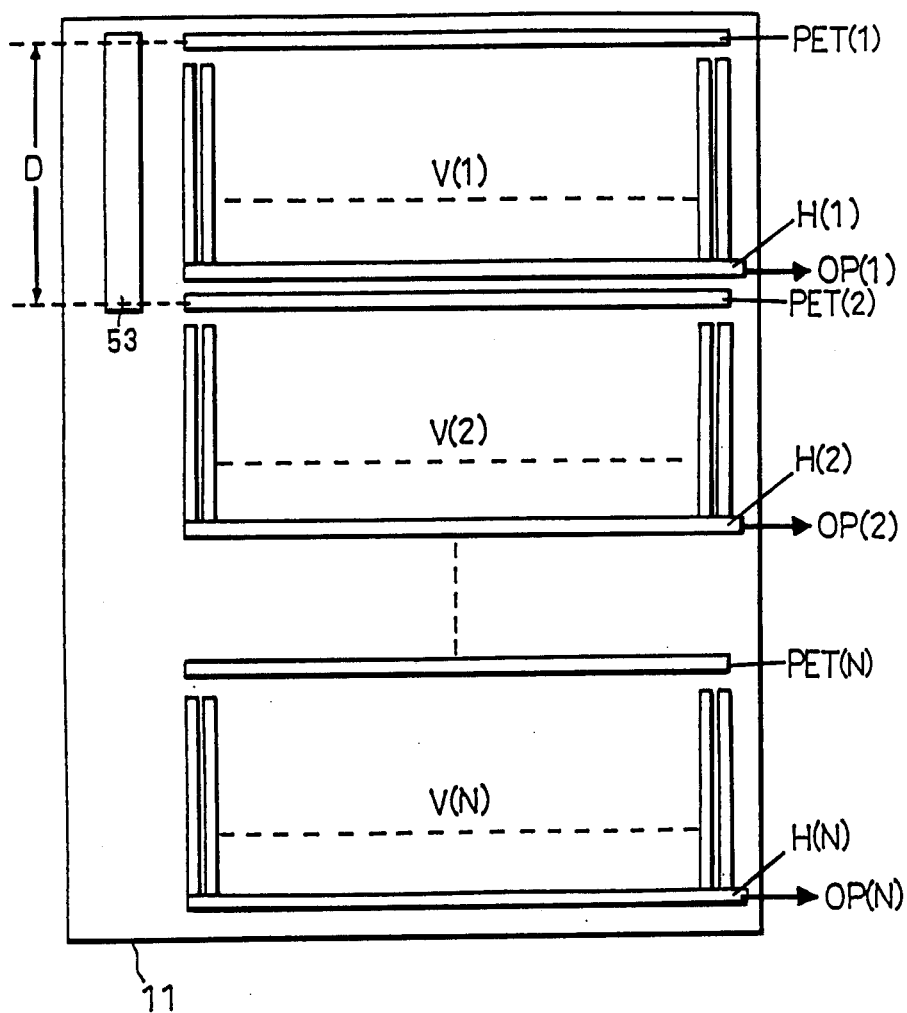

FIGS. 1(a) and 1(b) show two examples of structure of the image sensor according to the present invention. In FIG. 1(a), three lines of photoelectric converter arrays respectively corresponding to the three color filters, R, G and B (or cyan, magenta and yellow) are collectively placed in parallel: The three photoelectric converter lines make a line sensor to sense the three colors of a line of the object image at one time. In FIG. 1(b), one line of the photoelectric converter array makes the line sensor. N lines of the line sensors are placed in parallel with a predetermined distance to form the image sensor 11.

In FIG. 1(a), numeral 53 denotes photosensors for the scanning-position detection, R(n) is the n-th linear array of photoelectric converters corresponding to the red color, G(n) is the n-th photoelectric converter array for the green color, B(n) is the n-th photoelectric converter array for the blue color, V(n) is the n-th group of vertical CCDs, H(n) is the n-th horizontal CCD, and OP(n) denotes the n-th output signal. In this embodiment, a line R(n), a line G(n), a line B(n), an array group V(n) and a line H(n) compose a block, and N such blocks makes the whole image sensor 11.

By so composing in this embodiment, it is sufficient to scan the image sensor 11 (or the object image) as short as the distance between the blocks (or the distance D between R(1) and R(2) in FIG. 1(a)). If the vertical resolution of the sensed image is designed to be M, the scanning frequency G is M/N. For example, if M=4000 and N=40, then G=100, i.e., it is sufficient to scan (shift) only 100 times (within the distance D) to obtain the full image data with the vertical resolution of 4000 lines. This means that the number of photoelectric converters of this embodiment is 1/N that of 2-dimensional image sensor of the same resolution. This greatly reduces the defect ratio of the image sensor products and improves the yield ratio of the production.

Figure 6A:
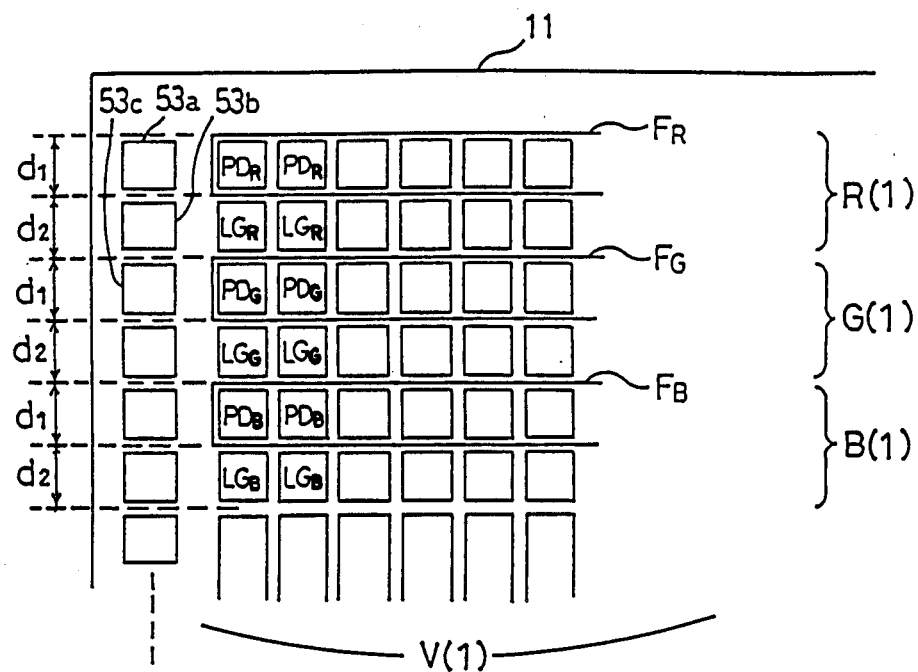
FIG. 6(a) shows a detailed structure of the image sensor of FIG. 1(a)

Detailed structure of the image sensor of FIG. 1(a) is now described referring to FIG. 6(a). The red photoelectric converters R(1) include a plurality of photoreceptors (or photodiodes) $PD_R$ covered by a long red filter $F_R$, and a plurality of logarithmic converters $LG_R$ each corresponding to one of the red photosensor $PD_R$. The green photoelectric converters G(1) and blue photoelectric converters B(1) have the same structure. When the object image is projected onto the image sensor 11, the image is decomposed into three colors by the respective color filters $F_R$, $F_G$ and $F_B$, and the color lights enter the photoreceptors $PD_R$, $PD_G$ and $PD_B$ where electrical charges are generated whose amount is proportional to the amount of the incident light. The signal proportional to the incident light is logarithmically converted by the logarithmic converters $LG_R$, $LG_G$ and $LG_B$, and is sent to one of the vertical CCD arrays V(1) where the signal is temporarily stored. When the photoelectric conversion of the next line is finished, the already stored signals are transferred downward by one step within the vertical CCDs V(1), and the newly generated signals are injected into the vertical CCDs V(1). Thus every time a line of the object image is converted into electrical signals by the photoelectric converters R(1), G(1) and B(1), the signals are sent and separately stored in the vertical CCDs V(1). When the image scanning is over (i.e., when the image is scanned by the distance D in FIG. 1(a), the signal charges stored in the vertical CCD arrays V(1) are transferred to the horizontal CCD H(1) line by line (i.e., signals in a vertical CCD array are transferred one by one into one element of the horizontal CCD corresponding to the vertical CCD array). The one line signal in the horizontal CCD H(1) is read out from the output terminal by the pixels.

The same description can be applied to the second to n-th blocks of the image sensor 11.

Thus the image sensor 11 of the present embodiment can take a picture at relatively high speed because the scanning distance D is rather short and no reading out process exists during image sensing. The image data temporarily stored in the vertical CCDs V(1) are read out after the complete picture is scanned. This enables slower data retrieval from the storage.

In FIG. 1(a), the elements 53a, 53b, 53c, ... are photosensors for detecting the scanning position. The vertical length $d_2$ of a logarithmic converter $LG_R$, $LG_G$ or $LG_B$ is preferably $n \cdot d_1$, where n is a natural number and $d_1$ is the vertical length of the photoreceptor $PD_R$, $PD_G$ or $PD_B$, because it is simpler in reconstructing the picture afterwards. In this embodiment, n is set at 1, i.e., a pixel has dimensions of $d_1 \cdot d_1$. Also, the scanning-position detection photosensors 53a, 53b, 53c, ... are preferably arranged at the pitch of $d_1$ and at the places corresponding to the image photosensors $PD_R$, $PD_G$ and $PD_B$.

Figure 6B:
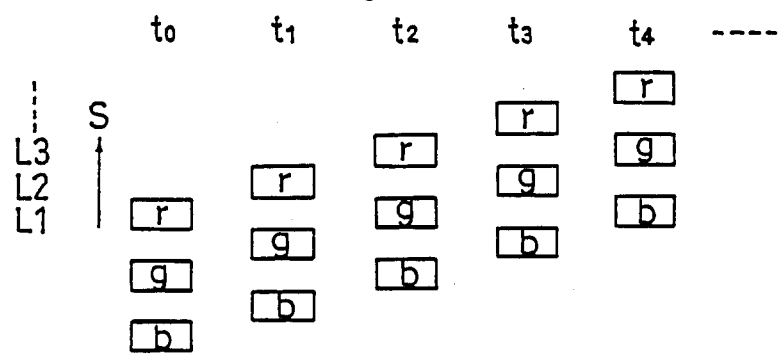
FIG. 6(b) illustrates photosensing timings of red, green and blue photoelectric converters.

Now the image sensing process during scanning is explained referring to FIG. 6(b). In the figure: L1, L2, L3, ... denote horizontal scanning lines; r, g and b are photoreceptors of the photoelectric converters R(1), G(1) and B(1); $t_0$, $t_1$, $t_2$, ... denote the photosensing time; and S is the scanning direction. The scanning starts at time $t_0$, and the photoreceptors move as shown in FIG. 6(b) at times $t_1$, $t_2$, $t_3$, $t_4$ ... The data correspondin to the red component on the line L1 is read out at time $t_0$, the green is at time $t_2$, and blue is at time $t_4$. Similarly, the red of the line L2 is read out at the time $t_1$, green is at the time $t_3$, and blue is at the time $t_5$. This is summarized in Table 1.

TABLE 1

| | Photosensing timings | | | |
|---|---|---|---|---|
| | L1 | L2 | L3 | L4 |
| r | $t_0$ | $t_1$ | $t_2$ | $t_3$ |
| g | $t_2$ | $t_3$ | $t_4$ | $t_5$ |
| b | $t_4$ | $t_5$ | $t_6$ | $t_7$ |

By this scanning method, three color data for a line are obtained at different timings with the picture resolution as fine as the vertical dimension of a photoreceptor, i.e., the vertical resolution can be as fine as the horizontal resolution. Though the three colors are not obtained at the same place and at the same time, it is easy to read out the data afterwards as if they are obtained at the same time at the same place. It is also possible to treat like that by changing the clock timing. For this data processing, it is necessary to know the exact position of the individual photoreceptors r, g and b in real time, or to precisely control the scanning speed. The position detector 14 is provided for this purpose. By casting a narrow monitor beam onto the scanning photosensors 53 of the image sensor 11, the precise relative position of the image sensor 11 and the object image is obtained.

In FIG. 1(b), PET(n) denotes the n-th linear array of photoelectric converters which corresponds to the three lines R(n), G(n) and B(n) of FIG. 1(a). The other components V(n), H(n) and OP(n) of the n-th block are the same as in FIG. 1(a). In this embodiment also the scanning time can be very short because the scanning distance is the distance D between adjacent blocks. This embodiment has an advantage over the previous embodiment (FIG. 1(a)) in that the structure is simpler which enables smaller horizontal photosensor pitch and smaller chip size. When a color picture is desired, three such image sensor chips 11 should be used, or stripe color filters should be used.

Figure 7:
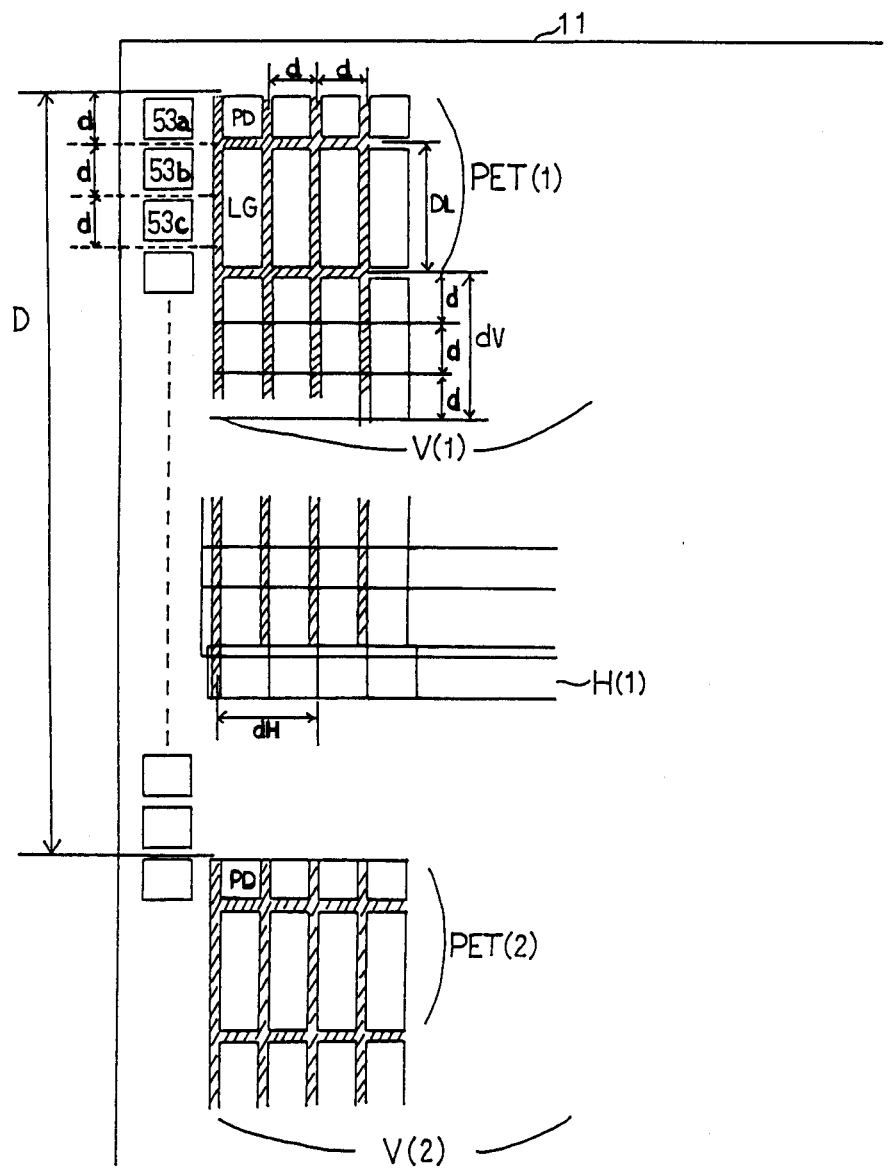
FIG. 7 shows a detailed structure of the image sensor of FIG. 1(b).

Detailed structure of the image sensor of FIG. 1(b) is now described referring to FIG. 7. The PET(1) consists of a horizontal linear array of photoreceptors (photodiodes) PD, and logarithmic converters LG each corresponding to one of the photoreceptors PD. Each of the vertical CCD arrays V(1) is placed proximate to a logarithmic converter LG. When light of the object image comes into the photoreceptor PD, electrical charges proportional to the incident light are generated in the photoreceptor PD. The signal proportional to the incident light is logarithmically converted by the logarithmic converters LG, and is sent into corresponding vertical CCD V(1), where the signal is temporarily stored. When the photoelectric conversion of the next line is finished, the already stored signals are transferred downward by one step within the vertical CCDs V(1), and the newly generated signals are injected into the vertical CCDs V(1). Thus every time a line of the object image is converted into electrical signals by the photosensors PD, the signals are sent and separately stored in the vertical CCDs V(1). When the image scanning is over (i.e., when the image is scanned by the distance D in FIG. 1(a)), the signals stored in the vertical CCD arrays V(1) are transferred to the horizontal CCD H(1) line by line (i.e., signals in a vertical CCD array are transferred one by one into one element of the horizontal CCD corresponding to the vertical CCD array). The one line signal in the horizontal CCD H(1) is read out from the output terminal by the pixels. In this embodiment, the elements are arranged so that $d + D_L + n_G \cdot d_V < D$, and $D/n_G = d$, where d is an array pitch of the photoreceptors PD, $D_L$ is the vertical length of the logarithmic converter LG, and $d_V$ is the array pitch of the elements (shift registers) of a vertical CCD V(1). Thus, reducing the shift register pitch $d_V$ is effective for reducing the dimensions of a pixel. For that reason, the vertical CCDs are preferably made of three layer polysilicon electrodes and are driven by a three-phase signal. If the vertical CCD V(1) is driven by a three-phase signal, it is natural to make the shift register pitch $d_H$ of the horizontal CCD H (1) as $d_H = 3 \cdot d$, and if it is driven by two- or four-phase signal, $d_H$ had better be $d_H = 2 \cdot d$, which the present embodiment adopts. In this case, since two vertical CCD arrays correspond to one horizontal shift register, signals of one line cannot be transferred to the horizontal CCD at a time. Therefore, in the present invention, signals of two adjacent vertical CCD arrays are alternately transferred to the horizontal CCD array, which will be detailed later.

Logarithmic Converter

Figure 2:
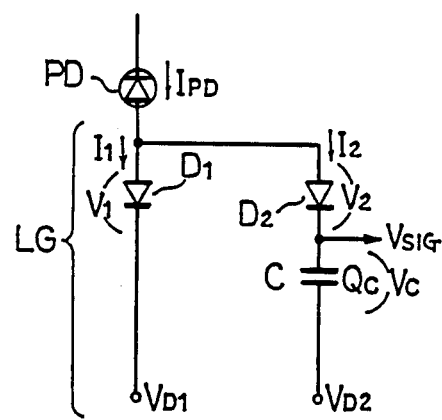
FIG. 2 is a circuit diagram of an example of the logarithmic conveter of the present invention.

Here an example of the logarithmic converter LG is described referring to FIG. 2.

Generally, a current I flowing through a diode is given by $$I = A_o \cdot \{\exp((Q \cdot V)/(k \cdot T)) - 1\} \quad (1)$$

where $A_o$ is a constant, V is the voltage applied to the diode, Q is the quantity of a unit electrical charge, and T is the temperature. Provided $\exp((Q \cdot V)/(k \cdot T)) \gg 1$, the above equation is approximated as $$\begin{aligned} I &\simeq A_o \cdot \exp((Q \cdot V)/(k \cdot T)) \\ &\simeq A_o \cdot \exp(B_o \cdot V), \end{aligned} \quad (2)$$

where $B_o = Q/(k \cdot T)$. Taking the logarithm of the equation (2), we obtain
$\ln I = \ln A_o + B_o \cdot V$, and $$V = (1/B_o) \cdot \ln I - (1/B_o) \cdot \ln A_o. \quad (3)$$

In FIG. 2: $I_{PD}$ is the current generated by the photodiode PD; $I_1$ is the current flowing through the diode $D_1$; $V_1$ is the voltage across the diode $D_1$; $I_2$ is the current flowing through the diode $D_2$; $V_2$ is the voltage across the diode $D_2$; $V_C$ is the voltage across the capacitor C, $V_{SIG}$ is the output voltage of this logarithmic converter; C is the capacitance of the capacitor C; $Q_C$ is the charge in the capacitor C, $V_{D1}$ is the source voltage connected to the diode $D_1$; and $V_{D2}$ is the source voltage connected to the diode $D_2$. In this case, $$I_{PD} = I_1 + I_2, \quad (4)$$

$$V_1 + V_{D1} = V_2 + V_{D2} = V_2 + V_C + V_{D2}, \quad 5)$$

$$V_1 = (1/B_o) \cdot \ln I_1 - (1/B_o) \cdot \ln A_o, \quad (6)$$

$$V_2 = (1/B_o) \cdot \ln I_2 - (1/B_o) \cdot \ln A_o, \quad (7)$$

$$Q_c = \int I_2 dt = C \cdot V_c, \text{ and} \quad (8)$$

$$Q = \int I_{PD} dt. \quad (9)$$

Substituting equations (6) and (7) into (5), $$\begin{aligned} & (1/B_o) \cdot \ln I_1 - (1/B_o) \cdot \ln A_o + V_{D1} \\ &= (1/B_o) \cdot \ln I_2 - (1/B_o) \cdot \ln A_o + V_c + V_{D2}, \text{ and} \\ V_c &= (1/B_o) \cdot \ln I_1 - (1/B_o) \cdot \ln I_2 + (V_{D1} - V_{D2}) \\ &= (1/B_o) \cdot \ln(I_1/I_2) + (V_{D1} - V_{D2}). \end{aligned} \quad (10)$$

Substituting $I_1 = I_{PD} - I_2$ of equation (4) into the equation (10), $$V_c = (1/B_o) \cdot \ln((I_{PD} - I_2)/I_2) + (V_{D1} - V_{D2}). \quad (11)$$

Substituting the equations $I_2 = d(C \cdot V_C)/dt$, and $I_{PD} = dQ/dt$, derived from the equations (8) and (9) into equation (11), $$V_c = (1/B_o) \cdot \ln[\{dQ/dt - d(C \cdot V_c)/dt\}/d(C \cdot V_c)/dt\}] + (V_{D1} - V_{D2}), \text{ or}$$

$$B_o \cdot (V_c + V_{D2} - V_{D1})$$
$$= \ln[\{dQ/dt - d(C \cdot V_c)/dt\}/d(C \cdot V_c)/dt\}]$$
$$= \ln\{dQ/d(C \cdot V_c) - 1\}.$$

Taking exponential of the equation, $$\exp(B_o \cdot V_C) \cdot \exp(B_o \cdot (V_{D2} - V_{D1})) = dQ/d(C \cdot V_C) - 1,$$
or $$\exp(B_o \cdot V_C) \cdot \exp(B_o \cdot V_{D2})/\exp(B_o \cdot V_{D1}) + 1 = dQ/d(C \cdot V_C).$$

Integrating the equation, $$\int [\exp(B_o \cdot V_C) \cdot \exp(B_o \cdot V_{D2})/\exp(B_o \cdot V_{D1}) + 1] d(C \cdot V_C) = \int dQ + D, \text{ or}$$

$$(C/B_o) \cdot \exp(B_o \cdot V_C) \cdot \exp(B_o \cdot V_{D2})/\exp(B_o \cdot V_{D1}) + C \cdot V_C = Q + D,$$

where D is an integral constant. Substituting this equation into equation (9), $$(C/B_o) \cdot \exp(B_o \cdot V_C) \cdot \exp(B_o \cdot V_{D2})/\exp(B_o \cdot V_{D1}) + C \cdot V_C - D = \int I_{PD} dt. \quad (12)$$

If the capacitance C of the capacitor C is chosen as to make $C \cdot V_C - d$ nearly zero, the equation (12) becomes as $$(C/B_o) \cdot \exp(B_o \cdot V_c) \cdot \exp(B_o \cdot V_{D2})/\exp(B_o \cdot V_{D1}) \approx \int I_{PD} dt, \text{ or}$$

$$\exp(B_o \cdot V_c) \approx \exp(B_o \cdot V_{D1})/\exp(B_o \cdot V_{D2}) \cdot (B_o/C) \cdot \int I_{PD} dt,$$

$$V_c \approx (1 - B_o) \cdot \ln\{\exp(B_o \cdot V_{D1})/\exp(B_o \cdot V_{D2}) \cdot (B_o/C) \cdot$$

$$\int I_{PD} dt\} = (1 - B_o) \cdot \ln(\int I_{PD} dt) + (1 - B_o) \cdot \ln(B_o/C) +$$

$$(1 - B_o) \cdot \ln(B_o \cdot V_{D1} - B_o \cdot V_{D2}) = (1 - B_o) \cdot \ln(\int I_{PD} dt) +$$

$$(1 - B_o) \cdot \ln(B_o/C) + V_{D1} - V_{D2}.$$

After all, $$V_{SIG} = V_c + V_{D2}$$
$$= (1 - B_o) \cdot \ln(\int I_{PD} dt) + (1 - B_o) \cdot \ln(B_o/C) + V_{D1},$$

which shows that the output voltage $V_{SIG}$ of the circuit of FIG. 2 is proportional to the logarithm of the integral amount of charges $\ln(\int I_{PD} dt)$ generated in the photodiode PD.

By providing such logarithmic converters LG to respective photosensors, output signal $V_{SIG}$ does not grow so large even when the integral amount of the incident light is very big, and the output will not saturate. Also, even when the incident light amount is very small, the output signal $V_{SIG}$ does not become so small. In any case, moderate output voltage $V_{SIG}$ is obtained for a very wide range of the incident light.

Data Processing

The processing of the data output from the image sensor 11 is now described. As shown in FIG. 3, the output analogue data is converted into digital data by the A/D converter 15, compressed by the data compressor 16, and then stored in the memory 17. The data compressor 16 can be omitted in this case, and the digital data can be directly sent to the data processor 2.

Since the image sensors 11 shown in FIGS. 1(a) and 1(b) have N blocks of photosensor lines and data storage CCDs, N signals are output in parallel from the terminals OP(1) through OP(N). These signals can be A/D-converted in parallel by N A/D converters 15-1 to 15-N, and can be compressed and stored also in parallel, which enables a rapid reading out process. Alternatively, it is possible to reduce the output line of the image sensor 11 to a single line by switching the clock signal $\phi_H$ for driving the charge transfer through the horizontal CCD arrays H(1) through H(N) and the clock signal $\phi_v$ for the vertical CCD arrays V(1) through V(N). In this case, one A/D converter, one data compressor and one memory are sufficient, and the number of terminals of the image sensor 11 can be reduced. In the latter (serial) output process, various methods can be adopted to read out the image data. In one method, the image data are read out by the blocks. In another method, the image data are read out by the lines (i.e., after reading out data of a line of a block, data of a line of the next block is read out). In the former method, several output lines (and thus several A/D converters) can be used to simultaneously output several lines of a block, which is a method intermediate between the parallel and serial methods. In this case, one can take any choice balancing both the reduction of the number of terminals of an image sensor and the reading out speed merit. For combining the analogue output lines of the image sensor, an analogue switch can be used, or an output selecting CCD can be used, which will be discussed later.

Various Photoelectric Converters

FIG. 8 shows various types of photoelectric converters.

Figure 8A:
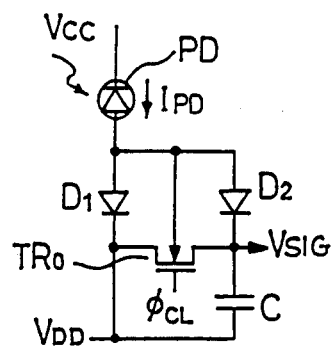
FIGS. 8(a) through 8(g) are circuit diagrams of some examples of the photoelectric converters according to the invention.

The circuit of FIG. 8(a) comprises: a reverse-biased silicon photodiode PD; first and second PN diodes $D_1$, $D_2$, which are connected in parallel with each other, connected to the photodiode PD to receive the photocurrent $I_{PD}$; a capacitor C connected in series with the second diode $D_2$; and a MOS reset transistor $TR_o$ for discharging the capacitor C. The output signal of the photoelectric converter is given by the voltage of the capacitor C.

Figure 8C:
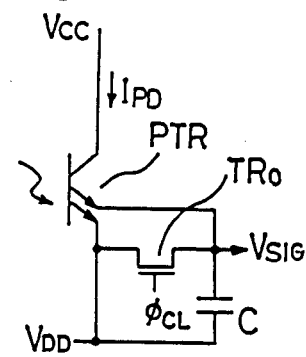
Figure 8B:
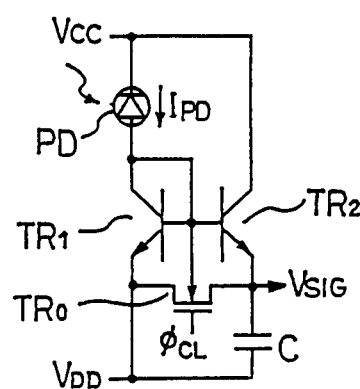

The circuit of FIG. 8(b) uses the base-emitter PN junctions of NPN transistors $TR_1$, $TR_2$ instead of the PN diodes $D_1$, $D_2$ of FIG. 8(a). Though the structure is more complex than the former example, the photodiode current $I_{PD}$ can be amplified by the transistors $TR_1$, $TR_2$, which makes a higher sensitive photoelectric converter.

The circuit of FIG. 8(c) uses a multi-emitter phototransistor PTR instead of the photodiode PD and the two NPN transistors $TR_1$, $TR_2$ of FIG. 8(b). The circuit can be simpler.

Figure 8D:
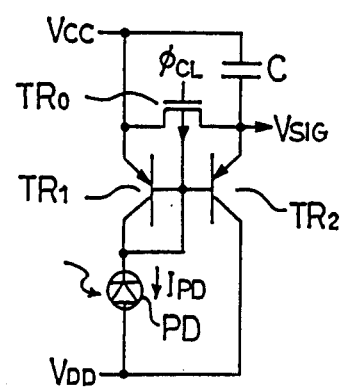

The circuit of FIG. 8(d) has a structure complementary to FIG. 8(b), using NPN transistors $TR_1$, $TR_2$ and a P-channel MOS transistor $TR_o$.

Figure 8E:
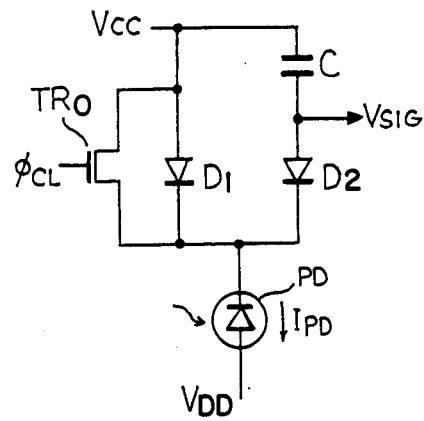

The circuit of FIG. 8(e) has a structure complementary to FIG. 8(a) and the N region of the photodiode PD and the diodes $D_1$, $D_2$ are made common, which simplifies the actual structure of the image sensor chip by using a P-type substrate.

Figure 8F:
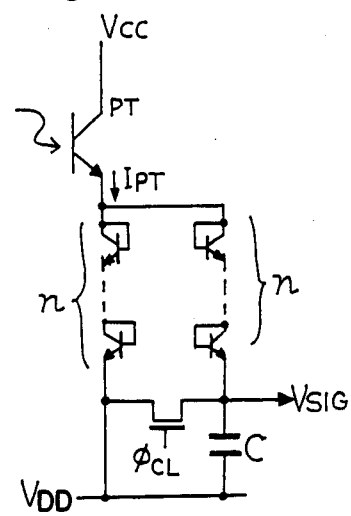

The circuit of FIG. 8(f) is an improvement of FIG. 8(a), where a phototransistor PT is used instead of the photodiode PD in order to amplify the photocurrent $I_{PT}$, and $2n$ pieces of PN diodes are employed in order to raise the output voltage by n times.

Figure 8G:
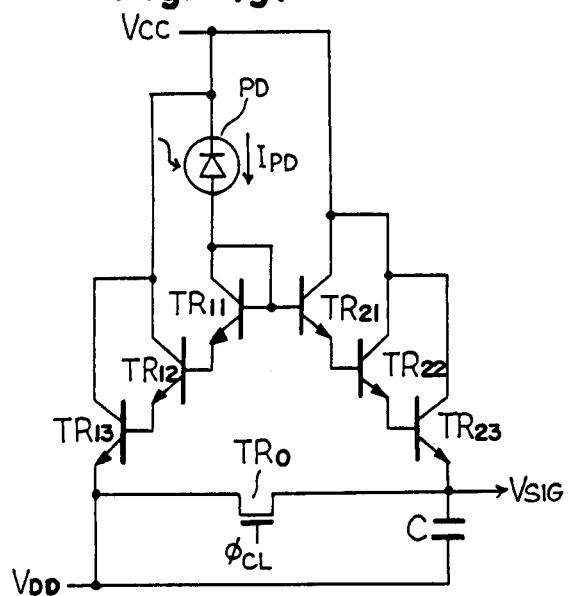

The circuit of FIG. 8(g) is an improvement of FIG. 8(b), where NPN transistors $TR_{11}$, $TR_{12}$, $TR_{13}$, $TR_{21}$, $TR_{22}$, $TR_{23}$ are Darlington-connected to increase the photocurrent $I_{PD}$ and raise the output voltage $V_{SIG}$.

The MOS transistors $TR_o$ in FIGS. 8(a)–8(d), 8(f) and 8(g) are used to clear out (discharge) the capacitor C. When a clear pulse $\phi_{CL}$ is applied to the gate, the transistor $TR_o$ turns conductive to drain the charges in the capacitor C. In the circuit of FIG. 8(e), the charges in the capacitor C is transferred to the CCD, and the MOS transistor $TR_o$ is used to initialize the circuit.

In the circuits of FIGS. 8(a), 8(b), 8(c), 8(f) and 8(g), the output voltage $V_{SIG}$ and the photocurrent $I_{PD}$ has a relation $$V_{SIG} \propto n \cdot \log(\int a \cdot I_{PD} dt),$$

where n and a are constants. This means that, in these circuits, the output $V_{SIG}$ is obtained logarithmic to the integral of the photocurrent $I_{PD}$ (which is proportional to the amount of the incident light).

In the circuits of FIGS. 8(d) and 8(e), $V_{SIG}$ and $I_{PD}$ has a relation $$V_{SIG} \propto V_{CC} - \log(\int I_{PD} dt).$$

In these circuits, also, the output voltage $V_{SIG}$ can be called logarithmic to the incident light amount.

The photoelectric converters as described above are distinct over prior photoelectric converters in that logarithmic conversion is performed within the photoelectric converters and the output voltage $V_{SIG}$ is already logarithmic to the incident light amount while the light is coming in the photoelectric converter. By constructing the logarithmic converter with bipolar transistors, diodes, MOS transistors and capacitors, the output voltage signal is further converted into charge amount signal, which is then treated in the CCDs. Those skilled in the art can design many other such circuits referring to the above examples.

DYNAMIC RANGE EXPANSION

Figure 9A:
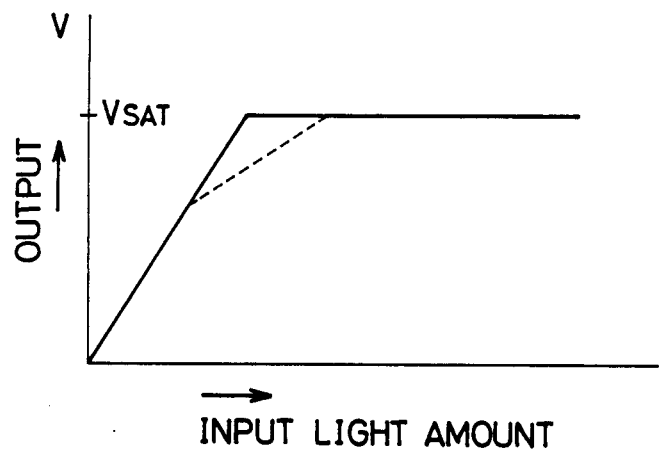
FIGS. 9(a) and 9(b) are graphs comparing the dymanic ranges of the prior art photosensor and photosensor according to the present invention.
Figure 9B:
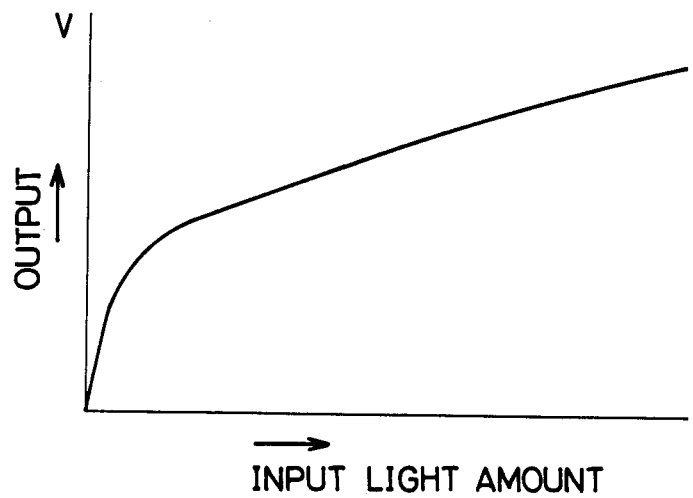

The expansion of the dynamic range of the image sensor by the logarithmic converter is explained referring to FIGS. 9(a) and 9(b). FIG. 9(a) is the graph of the output voltage V responsive to the input light amount of a prior solid state image sensor. The solid two-line curve shows the graph of normal image sensor in which the dynamic range is restricted by the saturation output voltage $V_{SAT}$ (the dynamic range is about $1:10^3$). An improved prior image sensor has a graph as shown by the broken line, in which the dynamic range is expanded only five times or so. In any case, the output is restricted by the capacity of the capacitor of the photogensis charges.

FIG. 9(b) is the graph of the image sensor using the logarithmic converter. The output voltage V does not grow proportional to the input light amount, and the dynamic range is expanded 100 times to the prior image sensors. This enables a long fixed exposure time (integration or accumulation time) without failure by saturation (over-exposure).

Detection of Scanning Position

Figure 10A:
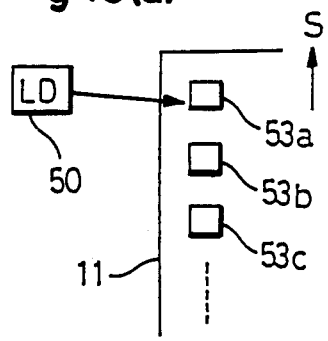
FIGS. 10(a) through 10(d) illustrate the scanning position detector of the image input device.
Figure 10B:
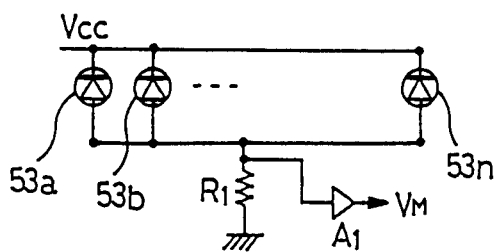

Scanning position of the image sensor 11 is detected by the structure shown in FIGS. 10(a) and 10(b). On the image sensor chip 11 are placed a plurality of silicon photodiodes 53a, 53b, 53c, ... The monitor beam from the laser diode 50 is spotted on one of the photodiodes, and as the image sensor 11 is scanned, the monitor beam moves through the photodiodes 53a, 53b, 53c, ...

The cathodes of the photodiodes 53a, 53b, 53c, ... are commonly connected, as shown in FIG. 10(b), to the source voltage $V_{CC}$, and the anodes to the ground via a resister R1. The voltage of the resister R1 is drawn via an amplifier $A_1$ to be the scan monitor output $V_M$. As the monitor beam moves along the photodiode array 53a, 53b, 53c, ... the monitor output $V_M$ changes as in FIG. 10(c), which shows a periodic change according to the photodiode array pitch. Using this monitor output $V_M$, the sensing by a photosensor line of the image sensor 11 is done when the monitor output $V_M$ is at its local maximum. The monitor output $V_M$ is used otherwise. By sampling the monitor output $V_M$ at a very short interval, the image data corresponding to this short sampling interval can be calculated in the data processing section 2 using the image data obtained at the normal frame monitoring interval. This image interpolation can improve the effective vertical resolution of the image, and can correct distortion of the moving image due to variation in the scanning speed.

Figure 10D:
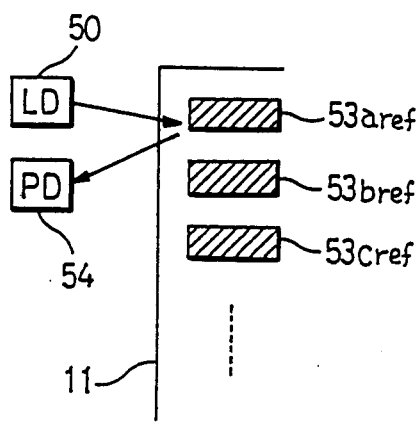
Figure 10C:
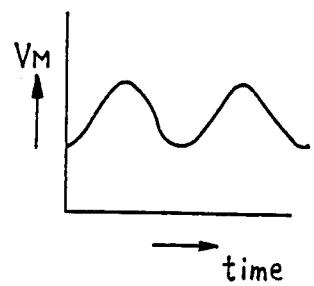

FIG. 10(d) shows a specific example of the scanning position detector using reflector plates $53a_{ref}$, $53b_{ref}$, $53c_{ref}$, ... such as aluminum foils. In this case, the monitor beam from the laser diode 50 is reflected by the reflectors $53a_{ref}$, $53b_{ref}$, $53c_{ref}$, ... and is received by a photodiode 54, which gives the output as in FIG. 10(c). Any other detector can be used instead.

Various Layer Structures of Photoelectric Converters

FIGS. 11(a)–11(d) show an example of the layer structure of the photoelectric converter shown in FIG. 8(a). In the figure: the numeral 60 denotes $N^-$-type silicon substrate, 61 is a $P^-$-type layer and 62 is an $N^+$-type layer which combination forms a photoreceptor (photodiode), 63 and 64 are $N^+$ layers forming cathodes of the diodes $D_1$ and $D_2$, 65 is a polysilicon electrode forming the capacitor C, 66 is a polysilicon electrode forming the gate of the clear MOS transistor $TR_0$, 67 is a color filter, 68a through 68d are conductors made of aluminum. The conductor 68a connects to the first source voltage $V_{CC}$, 68b to the second source voltage $V_{DD}$, and 68c to the clear pulse $\phi_{CL}$. The output voltage $V_{SIG}$ is obtained from the conductor 68d.

The silicon substrate 60 connects to the first source voltage $V_{CC}$, and hence the $P^-$ layer 61 of each photodiode receives reverse bias, which effectively separates the PN junctions of many photodiodes on a silicon substrate.

The photodiode PD of FIG. 8(a) is formed by the $P^-$ layer 61 and the $N^+$ layer 62, the diode $D_1$ is formed by the $P^-$ layer 61 and the $N^+$ layer 63, the diode $D_2$ is formed by the $P^-$ layer 61 and the $N^+$ layer 64, and the capacitor C is formed by the $N^+$ layer 64, an insulator 69 and the electrode 65 (MOS capacitor). The logarithmic output voltage $V_{SIG}$ comes out from the conductor 68d on the $N^+$ layer 64, and is sent to a vertical CCD V(1). Though not shown in FIG. 11, the surface except the color filter portion 67 is covered by a photo-shield layer.

Figure 12A:
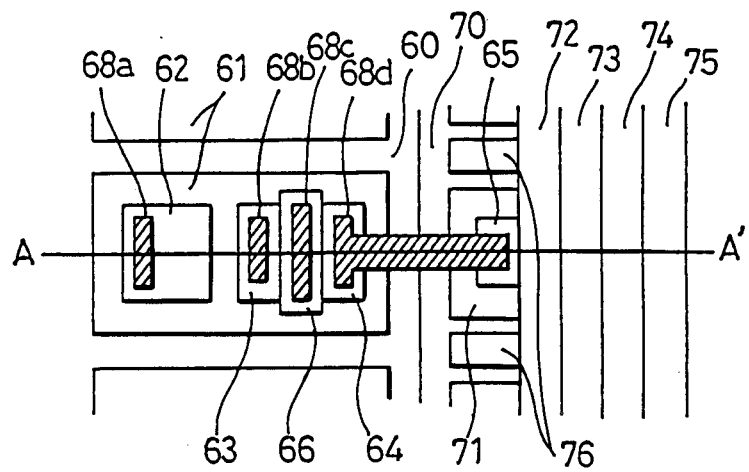
FIG. 12(a) is a plan view and FIG. 12(b) is a cross-sectional view along the line A—A' of the second example of the photoelectric converter shown in FIG. 8(a).
Figure 12B:
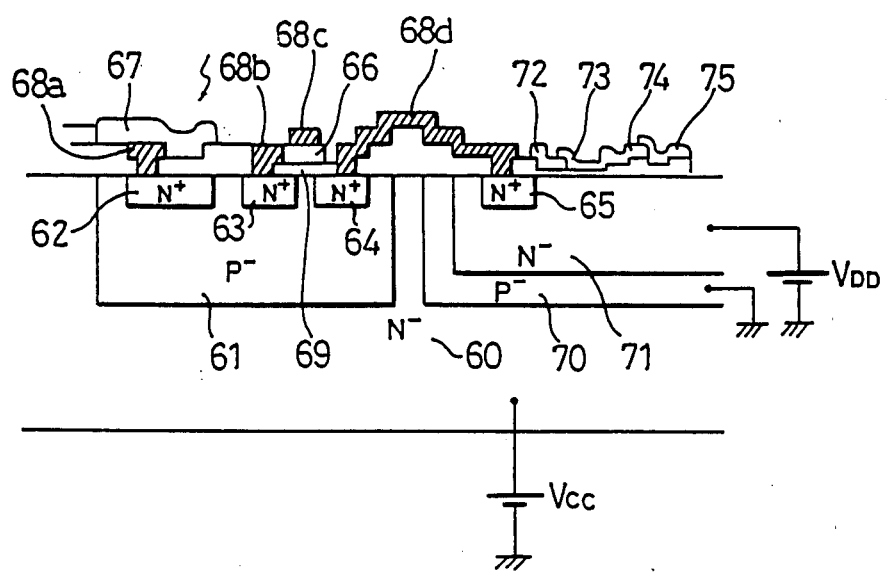
Figure 13A:
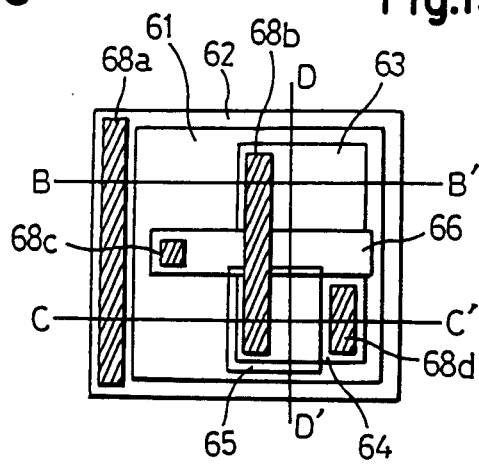
FIGS. 13(a) through 13(d) show the third example of the photoelectric converter shown in FIG. 8(a), where FIG. 13 (a) is the plan view
Figure 13D:
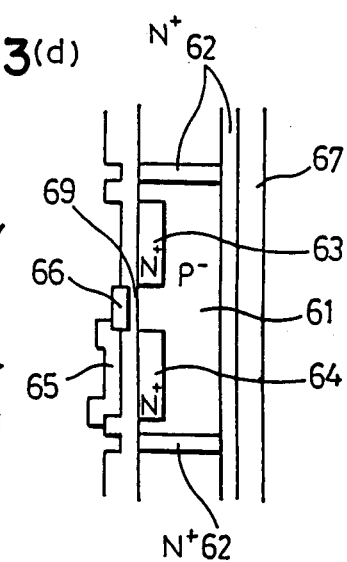
Figure 13B:
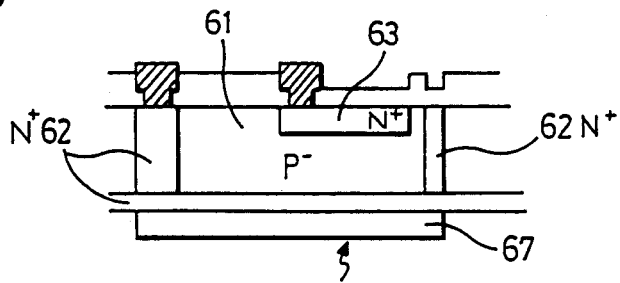
Figure 13C:
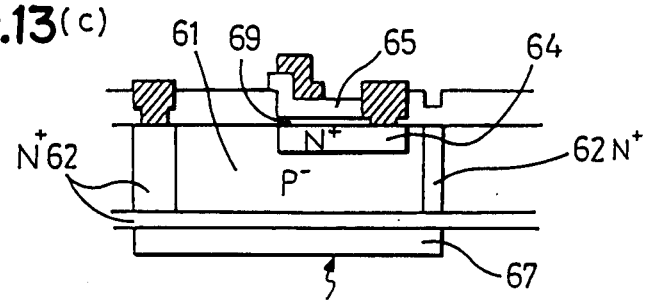

FIG. 12 shows a second example of the circuit of FIG. 8(a), in which the numeral 60 is an N⁻-type silicon substrate, 61 is a P⁻ layer forming a common anode of the diodes $D_1$ and $D_2$, 62 is an N⁺ layer forming the photodiode, 63 and 64 are separate P⁺ layers forming the cathodes of the diodes $D_1$ and $D_2$, 65 is an N⁺ layer for injecting the photocharges to the vertical CCD, 66 is a polysilicon electrode forming the gate of the MOS transistor $TR_o$ for clearing the accumulated charges, 67 is the color filter, 68a through 68d are aluminum conductor layers, 69 is an oxide layer forming the gate of the MOS transistor $TR_o$, 70 is a P⁻ layer forming the P⁻ well of the vertical CCD, 71 is an N⁻ layer forming the buried channel of the vertical CCD, 72 is a polysilicon electrode forming the charge storage, 73 is a polysilicon electrode forming the gate for transferring the stored charges to the transfer region, 74 and 75 are polysilicon electrodes forming the transfer gates and 76 is a P⁺ layer forming the channel stop. The conductor 68a connects to the first source voltage $V_{CC}$, 68b to the second source voltage $V_{DD}$, and 68c to the clear pulse $\phi_{CL}$. The output voltage $V_{SIG}$ is obtained from the conductor 68d and is input into the vertical CCD.

The silicon substrate 60 connects to the first source voltage $V_{CC}$, and hence the P⁻ layer 61 of each photodiode receives reverse bias, which effectively separates the PN junctions of many photodiodes on a silicon substrate. The P⁻ well 70 connects to the ground level and the N⁻ buried channel connects to the second source voltage $V_{DD}$, both of which receive reverse bias. This also separates adjacent PN junctions formed by N⁻ channels 71 and a P⁻ well 70. Here $V_{CC} > V_{DD} > 0$.

Similarly to the former example, the photodiode PD of FIG. 8(a) is formed by the P⁻ layer 61 and the N⁺ layer 62, the diode $D_1$ is formed by the P⁻ layer 61 and the N⁺ layer 63, and the diode $D_2$ is formed by the P⁻ layer 61 and the N⁺ layer 64. But the capacitor C here is formed by an addition of a MOS capacitor formed by the N⁺ layer 65 and the storage electrode 72 of the vertical CCD and a junction capacitor formed by the P⁻ well 70 and the N⁻ buried channel 71. The charges converted from the logarithmic voltage is directly injected into the vertical CCDs. Though not shown in FIG. 12, the surface except the color filter portion 67 is covered by a photo-shield layer.

Figure 11:
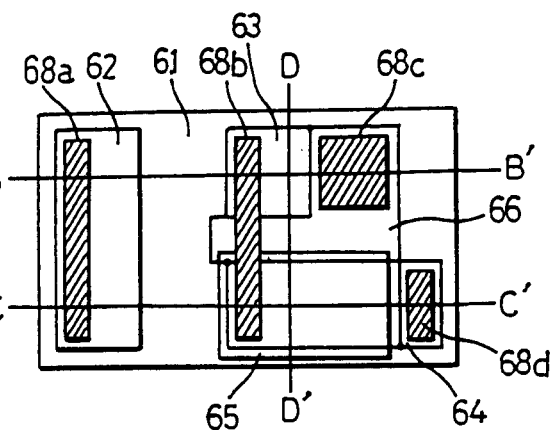
FIGS. 11(a) through 11(d) show a structure of the photoelectric converter shown in FIG. 8(a), where
Figure 11:
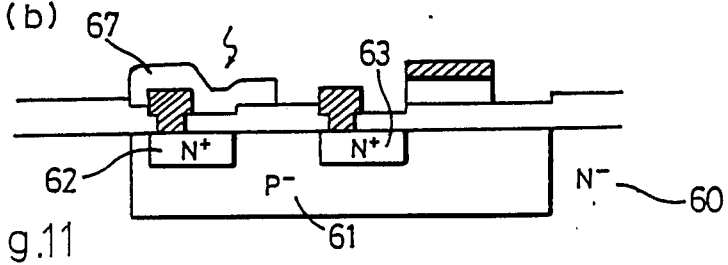
Figure 11:
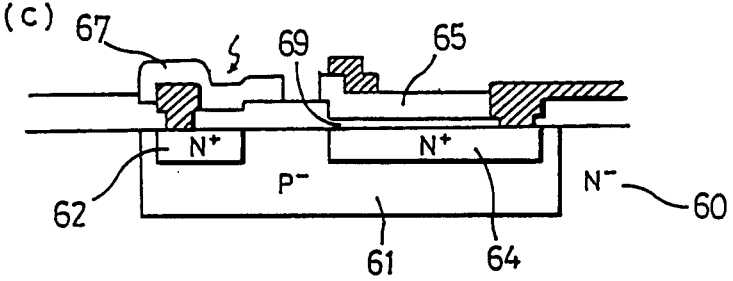
Figure 11:
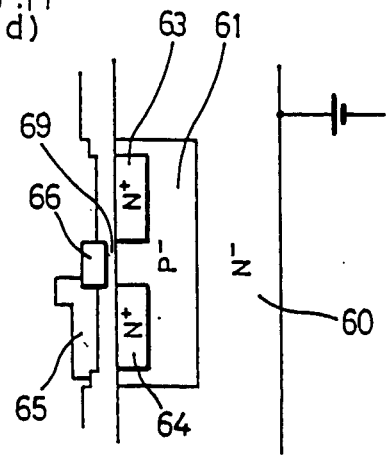

FIG. 13 shows a third example of the circuit of FIG. 8(a), in which the numerals are used the same as in FIG. 11. In this example, the color filter 67 is placed behind the chip and the light is designed to come from the back, which can increase the aperture ratio.

Figure 14A:
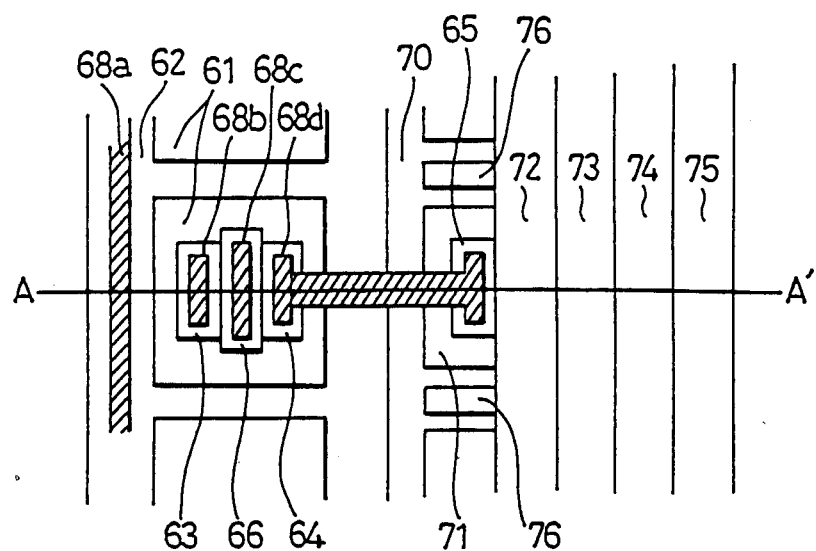
FIG. 14(a) is a plan view and FIG. 14(b) is a cross-sectional view along the line A—A' of the fourth example of the photoelectric converter shown in FIG. 8(a).
Figure 14B:
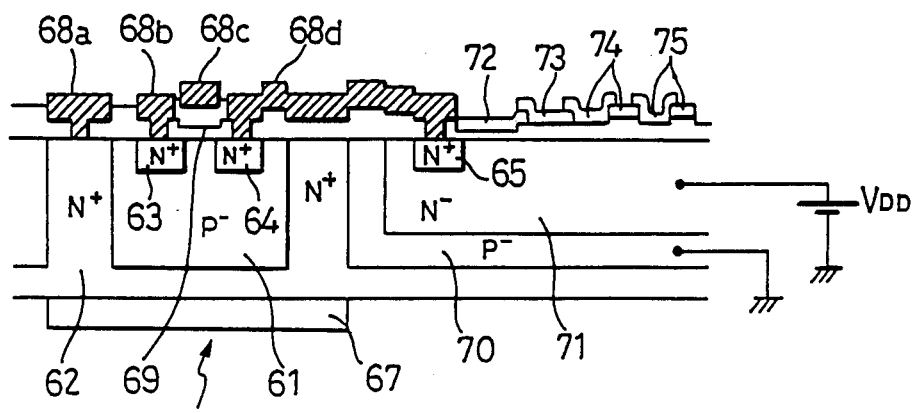

FIG. 14 shows a fourth example of the circuit of FIG. 8(a), in which the numerals are used the same as in FIG. 12. In this example, also, the color filter 67 is placed behind the chip and the light is designed to come from the back, which can increase the aperture ratio. The light is sensed by the PN junction formed by the N⁺ layer 62 at the back and the N⁻ layer 61.

Figure 15A:
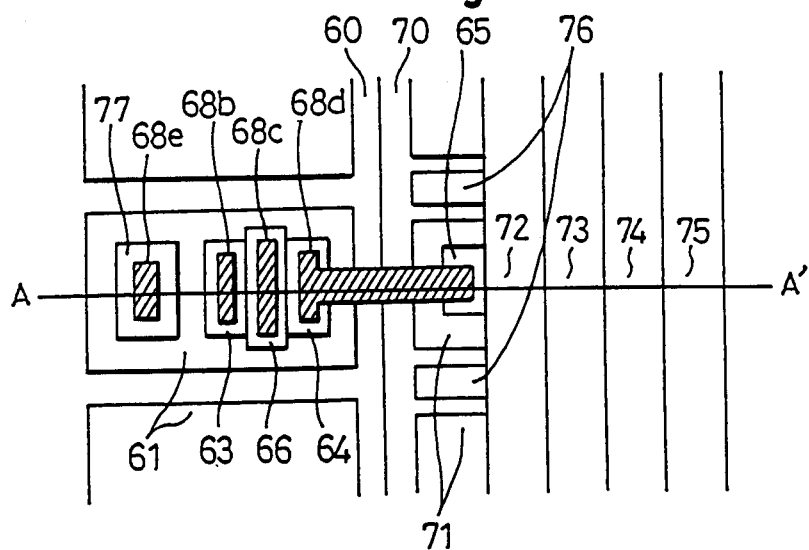
FIG. 15(a) is a plan view and FIG. 15(b) is a cross-sectional view along the line A—A' of the fifth example of the photoelectric converter shown in FIG. 8(a).
Figure 15B:
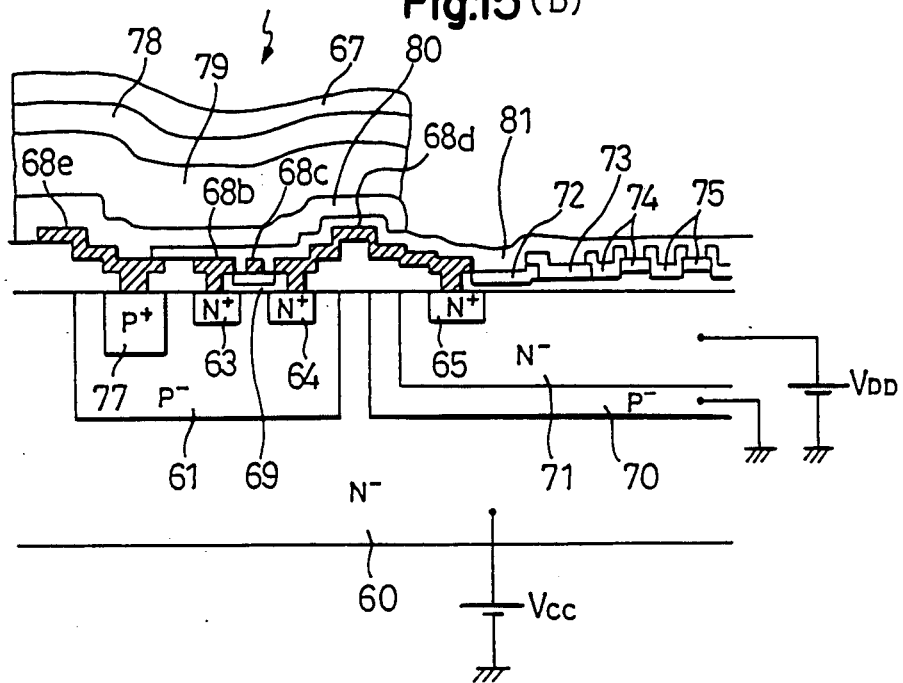

FIG. 15 shows a fifth example of the circuit of FIG. 8(a), in which the numerals 60–76 are used the same as in FIG. 12. The numeral 77 is a P⁺ layer for injecting the photocurrent, 78 is a transparent electrode such as ITO (Indium Tin Oxide), 79 is a photoconductive layer, 80 is a metal electrode for a pixel, 81 is an insulation layer, and 68e is an aluminum electrode layer. In this example, the transparent electrode 78 connects to the third source voltage $V_{EE}$ that has the relation $V_{DD} < V_{EE} \leq V_{CC}$, and the pixel electrode 80 has an ohmic connection with the P⁻ layer 61 through the aluminum electrode 68e and the P⁺ layer 77. The photodiode PD of FIG. 8(a) is formed by the transparent electrode 78, the photoconductive layer 79 and the pixel electrode 80. This structure can increase the photocurrent as well as the aperture ratio. The photoconductive layer 79 can be made of ZnS, CdS, amorphous silicon, etc.

FIG. 16 shows a layer structure of the photoelectric converter shown in FIG. 8(c). In the figure, the numeral 100 denotes a P⁻ silicon substrate, 101 is an N⁻ layer forming buried channel of the CCD, 102 is an N⁻ layer forming the collector of the phototransistor PTR, 103 is an N⁺ layer for providing an ohmic connection, 104 is a P⁺ layer forming the base of the phototransistor, 105 is an N⁺ layer forming the second emitter of the phototransistor, 107 is a polysilicon electrode forming the capacitor C, 108 is a P⁺ layer forming the channel stop region, 109 is an N⁺ layer forming the drain of the clear MOS transistor $TR_o$, 110 is the N⁺ layer forming the source of the clear MOS transistor $TR_o$, 111 is a polysilicon electrode forming the gate of the clear MOS transistor $TR_o$, 112a–112e are aluminum conductors, 113 is a polysilicon electrode forming the signal electrode, 114 is a polysilicon electrode forming the barrier electrode, 115 and 116 are polysilicon electrodes for the transfer drive signals, and 117 is an N⁺ layer forming the charge injection source. The conductor 112a connects to the first source voltage $V_{CC}$, the conductor 112b and 112d connect to the second source voltage $V_{DD}$, the conductor 112e connects to the charge injection drive pulse $\phi_{ID}$, and the conductor 112c connects to the signal electrode 113.

FIG. 17 shows a layer structure of the photoelectric converter shown in FIG. 8(e). In the figure, the numeral 100 denotes a P⁻ silicon substrate, 101 is an N⁻ layer forming buried channel of the CCD, 102 is an N⁻ layer forming anodes of the diodes $D_1$ and $D_2$, 121 is a P⁺ layer forming the photodiode, 122 and 123 are P⁺ layers forming the anodes of the diodes $D_1$ and $D_2$, 108 is a P⁺ layer forming the channel stop region, 109 is an N⁺ layer forming the drain of the clear MOS transistor $TR_o$, 111 is a polysilicon electrode forming the gate of the clear MOS transistor $TR_o$, 112a′–112d′ are aluminum conductors, 115 and 116 are polysilicon layers forming the transfer electrodes of the CCD, 124 is an N⁺ layer forming the capacitor for storing the logarithmic signal charges, 125 is a polysilicon electrode for transferring the charges in the capacitor 124 to the CCD. The conductor 112a′ and 112d′ connects to the first source voltage $V_{CC}$, the conductor 112b′ connects to the second source voltage $V_{DD}$, and the conductor 112c′ connects to the capacitor 124.

Operation of the Photoelectric Converters

Here the operations of the charge transfer (or charge injection) from the photoelectric converter R(1), G(1) or B(1) as shown in FIG. 11, 13 and 16 to the vertical CCD V(1), and the charge transfer within the vertical CCD V(1) are described.

Figure 18A:
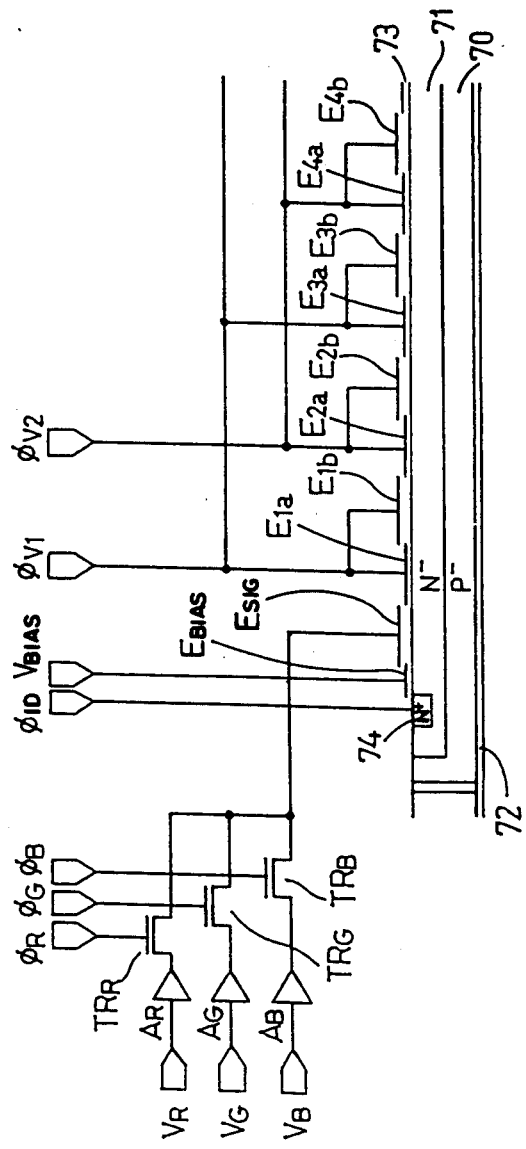
FIG. 18(a) shows a cross-sectional structure of a vertical CCD of the image sensor.

FIG. 18(a) shows a cross-sectional diagram of one of the vertical CCDs V(1), which has an N⁻-type buried channel 71 working as the potential well for storing the signal charges. The buried channel 71 is formed by injecting ions into the P⁻ silicon substrate 70. The side and back of the P⁻ substrate is coated by a P⁺ layer 72 to separate it from the other elements. A $SiO_2$ insulation layer 73 is formed on the buried channel 71, and a signal electrode $E_{SIG}$, barrier electrode $E_{BIAS}$ and transfer electrodes $E_{1a}, E_{1b}, \ldots, E_{4a}, E_{4b}, \ldots$ are formed on the insulation layer 73. Among these vertical CCD transfer electrodes, those at odd numbers $E_{1a}$, $E_{1b}$, $E_{3a}$, $E_{3b}$, . . . receive the first transfer clock signal $\phi_{V1}$, and those at even numbers $E_{2a}$, $E_{2b}$, $E_{4a}$, $E_{4b}$, . . . receive the second transfer clock signal $\phi_{V2}$. That is, the vertical CCD is driven by a two-phase clock signal. Adjacent transfer electrodes $E_{1a}$ and $E_{1b}$ (or $E_{2a}$ and $E_{2b}$) are made so that the potentials induced under them are different by differing the thickness of the insulator 73 by differing ion injection. The numeral 74 denotes the charge injection source formed by an N+ diffusion, which will be described later.

FIG. 18(a) also shows the circuit for injecting the signal voltage $V_R$, $V_G$ and $V_B$ into the vertical CCD V(1), where the voltage signals $V_R$, $V_G$ and $V_B$ are respectively given from the photosensors $PD_R$, $PD_G$ and $PD_B$ through the logarithmic converters $LG_R$, $LG_G$ and $LG_B$ at different timings. The voltage signals $V_R$, $V_G$ and $V_B$ are amplified by respective amplifiers $A_R$, $A_G$ and $A_B$ and input into the sources of the MOS transistors $TR_R$, $TR_G$ and $TR_B$. The MOS transistors $TR_R$, $TR_G$ and $TR_B$ become conductive by turning the gate voltage $\phi_R$, $\phi_G$ and $\phi_B$ positive, whereby the source voltage and the drain voltage become equal. By making the MOS transistors $TR_R$, $TR_G$ and $TR_B$ conductive by different timings, the voltage signals $V_R$, $V_G$ and $V_B$ amplified by the amplifiers $A_R$, $A_G$ and $A_B$ are applied on the input signal electrode $E_{SIG}$ of the vertical CCD V(1). We denote the amplified voltage as $V_{SIG}$, and the potential induced in the buried channel 71 under the signal electrode $E_{SIG}$ as $\phi_{SIG}$. The barrier electrode $E_{BIAS}$ is applied a constant bias voltage $V_{BIAS}$, and a potential $\phi_{BIAS}$ is induced under the electrode $E_{BIAS}$. The potential $\phi_{BIAS}$ is designed so that $\phi_{SIG} > \phi_{BIAS}$ for any signal voltage.

Figure 19:
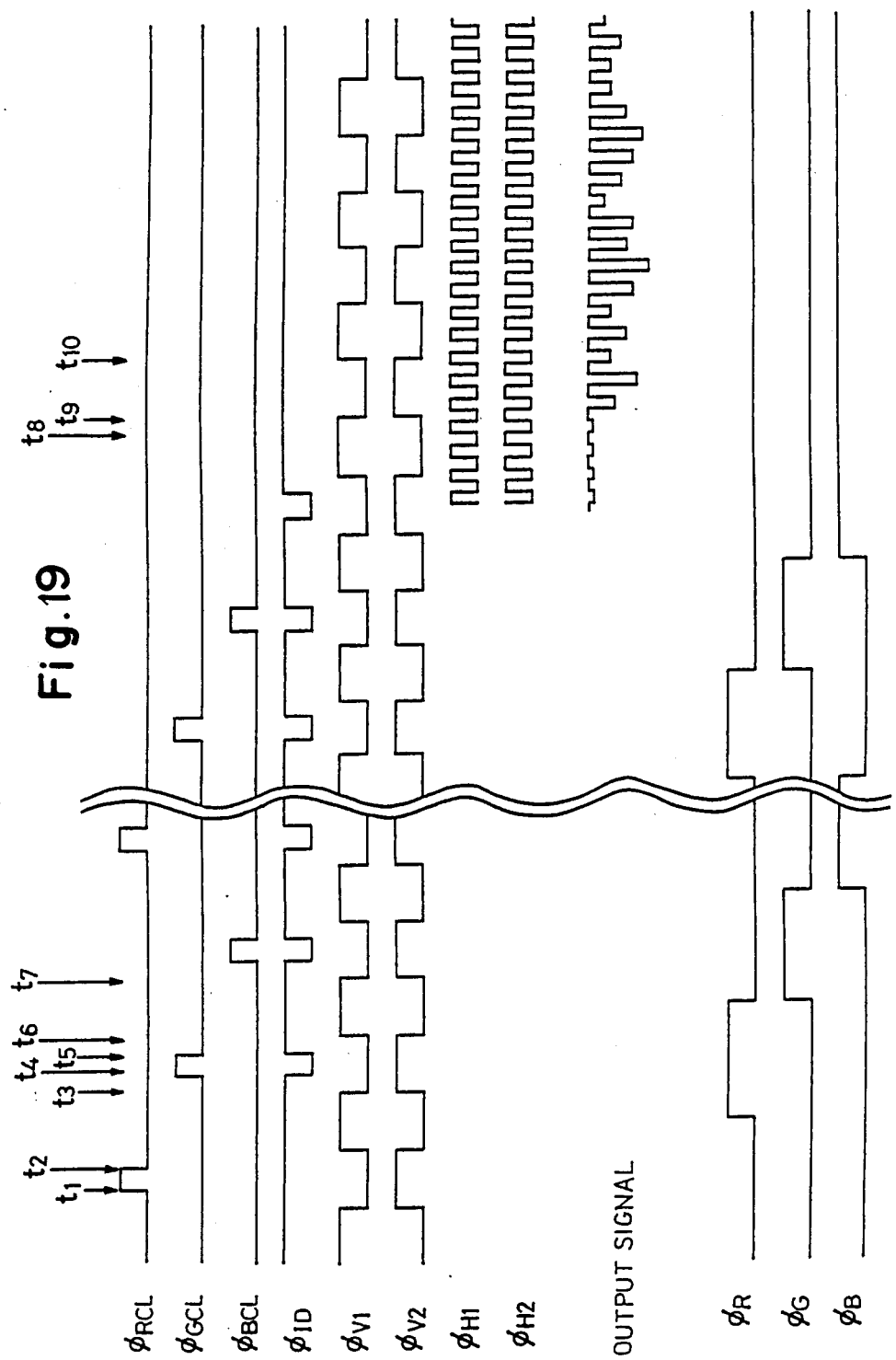
FIG. 19 is a timing chart of the photosensing and charge transfer of the image sensor.

The detail of the signal generation and the signal transfer in the image sensor 11 shown in FIG. 18(a) is now described referring to the timing chart of FIG. 19 and the potential diagrams of FIGS. 18(b)–18(f), which correspond to time $t_3$–$t_7$ of FIG. 19, respectively.

At time $t_1$, when a clear pulse $\phi_{RCL}$ is applied to the gate of the MOS reset transistor $TR_o$ of the logarithmic converter $LG_R$ for red light, the signal voltage $V_R$ is reset.

At time $t_2$, when the clear pulse $\phi_{RCL}$ turns to lower level, the reset of the logarithmic converter $LG_R$ is finished and the integration of the photocurrent from the photodiode $PD_R$ begins.

At time $t_3$, when the gate voltage $\phi_R$ turns high, the MOS transistor $TR_R$ turns on. At this time, the gate voltages for the other two colors $\phi_G$ and $\phi_B$ are low and the MOS transistors $TR_G$ and $TR_B$ are off, whereby the red signal voltage $V_R$ is amplified by the amplifier $A_R$ and is applied to the signal electrode $E_{SIG}$. The potential at time $t_3$ is as shown in FIG. 18(b).

At time $t_4$, when the charge injection signal $\phi_{ID}$ turns low, the voltage of the charge injection source 74 lowers and, as shown by the hatching of FIG. 18(c), charges are filled under the barrier electrode $E_{BIAS}$ and the signal electrode $E_{SIG}$.

At time $t_5$, when the charge injection signal $\phi_{ID}$ turns high, the potential at the charge injection source 74 lowers and the charges $Q_S$ remain under the signal electrode $E_{SIG}$. The amount of the remaining charges $Q_S$ is given by $$Q_S = C_S \times (\phi_{SIG} - \phi_{BIAS}),$$

where $C_S$ is the capacitance of the signal electrode $E_{SIG}$. This means that the amount of the charges corresponds to the signal voltage $V_{SIG}$, i.e., voltage-to-charge conversion is performed.

At time $t_6$, when the first transfer clock signal $\phi_{V1}$ for the vertical CCD turns from low to high and the second clock signal $\phi_{V2}$ turns from high to low, the potentials under the transfer electrodes $E_{1a}$ and $E_{1b}$ neighboring the signal electrode $E_{SIG}$ lower and thus the charges $Q_S$ are transferred to the potential well under the transfer electrode $E_{1b}$.

At time $t_7$, when the first clock signal $\phi_{V1}$ turns from high to low and the second clock signal $\phi_{V2}$ turns from low to high, the charges under the transfer electrode $E_{1b}$ are transferred to the potential well under the transfer electrode $E_{2b}$, which is the same potential state as the time $t_3$.

Then, the clear pulse $\phi_{GCL}$ for the green color which is one transfer clock cycle delayed from the red clear pulse $\phi_{RCL}$ triggers the integration of the green photocurrent and the green signal voltage $V_G$ is read out similarly. Further, the blue clear pulse $\phi_{BCL}$ which is one transfer clock cycle delayed from the green clear pulse $\phi_{GCL}$ triggers the integration of the blue photocurrent and the blue signal voltage $V_B$ is read out similarly. Thus the image data for one pixel is generated and transferred for the three colors. By repeating the cycle, the image data for a picture is generated and transferred.

Now the charge transfer from one of the vertical CCDs V(1) to an element of the horizontal CCD H(1) is described.

FIG. 20(a) shows the cross-sectional diagram around the junction of a vertical CCD V(1) and a horizontal CCD H(1), where $E_{601a}$, $E_{601b}$, . . . , $E_{605a}$, $E_{605b}$ are the transfer electrodes at the end of the vertical CCD V(1). Among the vertical transfer electrodes, those at odd numbers $E_{601a}$, $E_{601b}$, $E_{603a}$, $E_{603b}$, $E_{605a}$, $E_{605b}$ receive the first transfer clock signal $\phi_{V1}$, and those at even numbers $E_{602a}$, $E_{602b}$, $E_{604a}$, $E_{604b}$ receive the second transfer clock signal $\phi_{V2}$. A barrier electrode $E_{VOG}$ is provided between the last element of the vertical CCD V(1) and an element of the horizontal CCD H(1) in order to make a potential barrier for preventing charge backflow from the horizontal CCD H(1) to the vertical CCD V(1), where a constant bias $\phi_{VOB}$ is applied to the barrier electrode $E_{VOG}$. $E_{Hn}$ denotes a transfer electrode of the horizontal CCD H(1).

The time $t_8$ in FIG. 19 is the time when the scanning is finished and image data from all the pixels have been stored in the vertical CCDs V(1). At this time, the potential is as shown in FIG. 20(b).

At time $t_9$, when the first transfer clock signal $\phi_{V1}$ of the vertical CCD turns from high to low and the second clock signal turns from low to high, charges are transferred within the vertical CCD, and the charges in the potential well under the last electrode $E_{605b}$ override the potential barrier under the barrier electrode $E_{VOG}$ to transfer to a potential well under a transfer electrode $E_{Hn}$ of the horizontal CCD H(1), as shown in FIG. 20(c). After that, the charges are transferred within the horizontal CCD H(1) driven by the horizontal transfer clock signals $\phi_{H1}$ and $\phi_{H2}$ (cf. FIG. 20(d)).

At time $t_{10}$, when the vertical first transfer clock signal $\phi_{V1}$ turns from low to high and the second clock signal $\phi_{V2}$ turns from high to low, charges further proceed within the vertical CCD, and the signal charges of the next line come in the potential well under the last electrode $E_{605b}$, as shown in FIG. 20(e). By repeating the process, the signal charges stored in the vertical CCDs V(1) are read out line by line as shown in FIG. 19.

Figure 21:
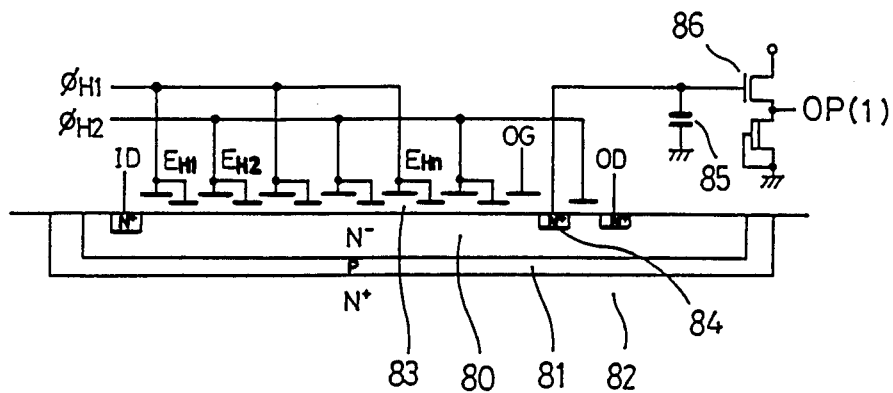
FIG. 21 shows a cross-sectional structure of a horizontal CCD of the image sensor.

FIG. 21 shows a cross-sectional diagram of the horizontal CCD H(1). The horizontal CCD H(1) is also constructed as a known buried channel CCD. At the side and back of the P-type substrate 81 is formed an N+ layer 82 to separate the horizontal CCD H(1) from other elements. Within the P-type substrate 81 is formed an N−-type buried channel 80. On the buried channel 80 are formed transfer electrodes $E_{H1}$, $E_{H2}$, $E_{H3}$, ..., $E_{Hn}$ via a SiO$_2$ insulator. Two-phase transfer signals $\phi_{H1}$ and $\phi_{H2}$ are alternately applied to the horizontal transfer electrodes $E_{H1}$, $E_{H2}$, $E_{H3}$, ..., $E_{Hn}$. In the figure, OG denotes a barrier electrode for preventing backflow, ID is the charge injection gate, and OD is the charge output gate. The amount of charges coming out of the N+ layer 84 through the barrier gate OG is converted into corresponding voltage by the capacitor 85, and the voltage is taken out as the output signal OP(1) through the source follower 86.

In the above explanation, the voltage signal $V_{SIG}$ of the three colors are serially sent into the vertical CCD V(1). The following is the description for the parallel transfer.

FIG. 22 shows one of the vertical CCDs V(1) and the corresponding photoelectric converters of a pixel. In the figure, the numerals 90, 91 and 92 denote photoelectric converters for the red, green and blue colors respectively, which correspond to three elements 93, 94 and 95 of the vertical CCD V(1). One element 93 of the CCD has four transfer electrodes 93a–93d, as shown in FIG. 22 (b). The electrodes 93a–93d are formed by separate polysilicon layers, and the potentials under the electrodes 93a and 93c are made different from those under the electrodes 93b and 93d by changing the thickness of the insulator 73. The numeral 70 denotes the buried channel of the vertical CCD V(1) which is made by injecting N−-type impurity ions into the P-type substrate 71, and the numeral 72 is an N+ separation layer.

The signal voltage $V_{SIG}$ generated by the red photoelectric converter 90 and logarithmically converted is applied to the voltage-charge converter 93e neighboring one of the transfer electrodes 93d of the first element of the vertical CCD V(1) via the aluminum wire 97. Similarly, the green and blue signal voltages are applied to the voltage-charge converters 94e and 95e neighboring the transfer electrodes 94d and 95d of the second and third elements of the vertical CCD V(1) via the aluminum wires 98 and 99. In this case, as described before for the serial signal transfer, the signal voltages can be applied to the voltage-charge converters 93e, 94e and 95e after they are amplified by respective amplifiers.

Figure 23:
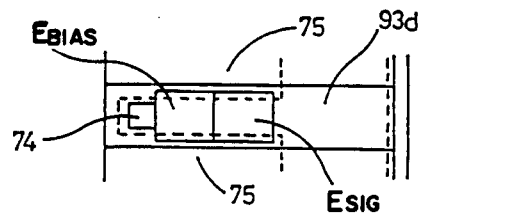
FIG. 23(a) is a plan view and FIG. 23(b) is a cross-sectional view of voltage-charge converting section.
FIGS. 23(c) through 23(f) are potential diagrams corresponding to times $t_2$ through $t_5$ of FIG. 24.
Figure 23:
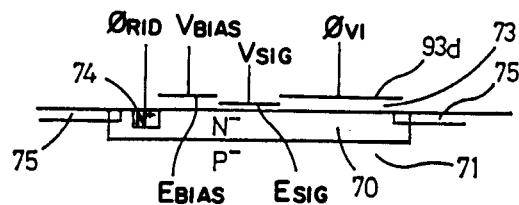

FIG. 23 illustrates a voltage-charge converter 93e. In FIG. 23(a) and 23(b), the numeral 75 denotes P+ layers forming channel stops for separating transfer channels of neighboring vertical CCDs V(1), and numeral 74 is an N+ layer forming a charge injection source. $E_{SIG}$ and $E_{BIAS}$ are respectively an input signal electrode and a barrier electrode both made of polysilicon layers placed over the buried channel 71 via an insulator 73. Responsive to the voltage applied to these electrodes $E_{SIG}$ and $E_{BIAS}$, potential wells are formed within the buried channel 71. The barrier electrode $E_{BIAS}$ receives a constant voltage $V_{BIAS}$, and the signal voltage $V_{SIG}$ is applied to the input signal electrode $E_{SIG}$ from the photoelectric converter 90 via the aluminum wire 97. The bias voltage $V_{BIAS}$ is determined so that the potential well $\phi_{BIAS}$ under the electrode $E_{BIAS}$ is shallower than the potential well $\phi_{REF}$ produced under the electrode $E_{SIG}$ at the minimum value $V_{REF}$ (which is called "reference voltage") of the signal voltage $V_{SIG}$.

Figure 24:
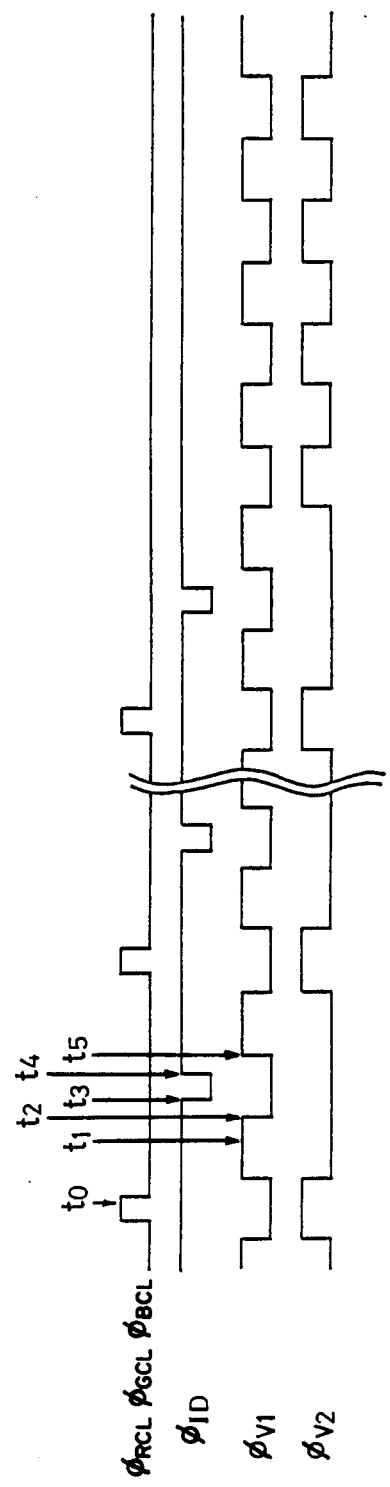
FIG. 24 is the timing chart.

The parallel charge input into the vertical CCD V(1) is explained referring to the potential diagrams of FIGS. 22(c)–22(g), FIGS. 23(c)–23(f) and the timing chart of FIG. 24.

At time $t_0$, when a clear pulse $\phi_{RCL}$ is applied to the integration-clear gate of the red photoelectric converter 90, the voltage of the capacitor C is reset at the reference voltage $V_{REF}$ and the charge accumulation begins.

At time $t_1$, the potential state is as shown in FIG. 22(c), where the vertical first transfer signal $\phi_{V1}$ is high and the second signal $\phi_{V2}$ is low.

At time $t_2$, when the first signal $\phi_{V1}$ turns low, the charge injection is prepared (FIG. 22(d)).

At time $t_3$, when the charge injection signal $\phi_{ID}$ turns low and the potential of the charge injection source 74 of the voltage-charge converter rise, charges fill the areas under the barrier electrode $E_{BIAS}$ and the input signal electrode $E_{SIG}$, as shown by the hatching of FIG. 23(d). The potential of the charge injection source 74 of the voltage-charge converter is set so that it is lower than that under the electrode 93d of the vertical CCD V(1).

At time $t_4$, when the charge injection signal $\phi_{ID}$ returns high and the potential of the charge injection source 74 lowers, charges corresponding to the difference between the potential $\phi_{SIG}$ under the input signal electrode $E_{SIG}$ and the potential $\phi_{BIAS}$ under the neighboring barrier electrode $E_{BIAS}$ are collected under the input signal electrode $E_{SIG}$ (FIG. 23(e)). The amount of the charges $Q_S$ is give by $$Q_S = C_S \times (\phi_{SIG} - \phi_{BIAS}),$$

where $C_S$ is the capacitance of the input signal electrode $E_{SIG}$.

At time $t_5$, when the first transfer clock signal $\phi_{V1}$ turns high, the charges $Q_S$ transfer to the potential well under the transfer electrode 93d of the vertical CCD V(1).

The above actions are simultaneously performed for the three colors, where the red signal is transferred to the element 93, green to the element 94 and blue to the element 95 (FIG. 22(c)).

Then, by the first and second transfer clock signals $\phi_{V1}$ and $\phi_{V2}$, the three signals are transferred three steps, as shown by FIG. 22(f), and new signals are injected into the vertical CCD V(1).

Since, as shown in FIG. 6(b), the R, G, and B signals are produced at different timings in one pixel, the red signal of the first pixel is obtained from the third element of the first three elements, green is from the second element of the next three elements and blue is from the first element of the next three elements.

Now the second example of the transfer operation from the photoelectric converters R(1), G(1) and B(1) as shown in FIGS. 12, 14 and 15 to the vertical CCDs V(1) and within the the vertical CCDs V(1) is described.

FIG. 25(a) shows the cross-sectional diagram of one of the vertical CCDs V(1). The CCD has an N−-type buried channel 71 and a P− well 70 in which the channel 71 is buried. The P⁻ well 70 is formed by injecting ions into an N⁻ substrate 60, and the buried channel 71 formed by further injecting different ions into the P⁻ well 70. A $SiO_2$ insulation layer 82 is placed on the buried channel 71, and a storage electrode $E_{ST}$, a gate electrode $E_{TR}$, and transfer electrodes $E_{1a}$, $E_{1b}$, ..., $E_{4a}$, $E_{4b}$, ... for the vertical CCD are formed on the insulation layer 82. The transfer electrodes at odd numbers $E_{1a}$, $E_{1b}$, $E_{3a}$, $E_{3b}$, ... receive the first transfer clock signal $\phi_{V1}$, and those at even numbers $E_{2a}$, $E_{2b}$, $E_{4a}$, $E_{4b}$, ... receive the second signal $\phi_{V2}$. That is, the vertical CCD V(1) of this example is driven by a two-phase clock signal. The potential induced under the transfer electrode $E_{1a}$ (or $E_{2a}$, etc.) is different from the potential induced under the transfer electrode $E_{1b}$ (or $E_{2b}$, etc.) by differing the thickness of the insulation layer under the electrode $E_{1a}$ from that under the electrode $E_{1b}$ or by differing the ion injection under the electrode $E_{1a}$ from that under the electrode $E_{1b}$ or such. The region 65 is formed by N⁺diffusion to discharge the electrical charges.

FIG. 25(a) also shows the circuit for injecting the signal charges $Q_R$, $Q_G$ and $Q_B$ which are given from the photodiodes $PD_R$, $PD_G$ and $PD_B$ through the logarithmic converters $LG_R$, $LG_G$ and $LG_B$ at different timings to the vertical CCDs V(1). The MOS transistors $TR_R$, $TR_G$ and $TR_B$ are used to select one of the signal charges $Q_R$, $Q_G$ and $Q_B$. When one of the gate voltages $\phi_R$, $\phi_G$ and $\phi_B$ turns positive, the transistor $TR_R$, $TR_G$ or $TR_B$ becomes conductive and passes the charges $Q_R$, $Q_G$ or $Q_B$. As the gate voltages $\phi_R$, $\phi_G$ and $\phi_B$ are sequentially turned positive, the charges $Q_R$, $Q_G$ and $Q_B$ are injected through the N⁺ region 65 and the potential well under the storage electrode $E_{ST}$.

Figure 26:
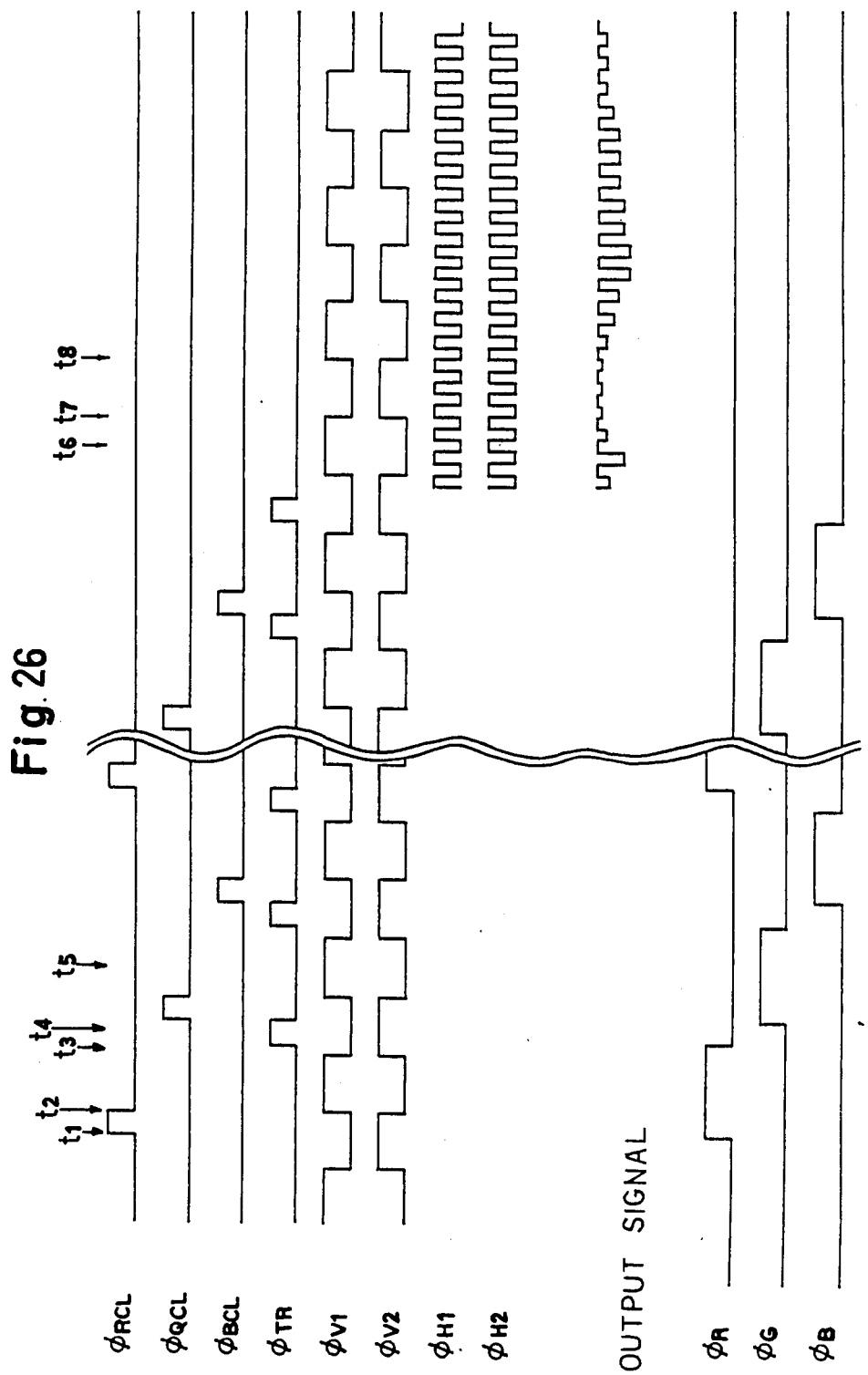
FIG. 26 is a timing chart of the photosensing and charge transfer of the image sensor.

The operation is detailed referring to the timing chart of FIG. 26 and the potential diagrams of FIG. 25(b)–25(f) respectively corresponding to time $t_1$–$t_5$ of FIG. 26.

At time $t_1$, when the red gate voltage $\phi_R$ turns high but those $\phi_G$ and $\phi_B$ for the other two transistors remain low, the red MOS transistor $TR_R$ turns on (conductive). At this time, since the clear pulse $\phi_{RCL}$ also turns high, the reset MOS transistor $TR_{RCL}$ turns on, whereby the storage ST is reset and charges come there until the potential becomes $\phi_{RS}$.

At time $t_2$, when the clear pulse $\phi_{RCL}$ turns low, the reset state finishes. Since the gate voltage $\phi_R$ is still high, i.e., the transistor $TR_R$ is still on, the integration of the photocurrent from the photodiode $PD_R$ begins. The potential state at this time $t_2$ is as shown in FIG. 25 (c).

At time $t_3$, when the gate voltage $\phi_R$ turns low, the MOS transistor $TR_R$ turns off and the charge accumulation stops. The potential state is as shown in FIG. 25(d), where charges equal to the signal charges $Q_R$ are discharged. Provided that the capacitance of the storage ST is $C_S$ and the total charge amount at the time of resetting is $Q_O$, the remaining charges $Q_S$ is $$Q_S = C_S \times (\phi_{ST} - \phi_{RS}) - Q_R$$
$$= Q_o - Q_R.$$

This means that the charge decrease in the storage ST from the time of resetting equals the signal charges $Q_R$.

At time $t_4$, when the clock signal on the gate electrode $E_{TR}$ turns from high to low, the potential under the electrode $E_{TR}$ lowers and the charges $Q_S$ remaining in the storage ST transfer to the potential well under the transfer electrode $E_{1b}$. FIG. 25(e) shows the potential state at this time $t_4$.

At time $t_5$, when the first transfer clock signal $\phi_{V1}$ turns from high to low and the second clock signal from low to high, the charges under the electrode $E_{1b}$ transfer to the potential well under the electrode $E_{2b}$, where the potential state returns to that at time $t_1$.

Then the green signal charges $Q_G$ are similarly discharged using the green clear pulse $\phi_{GCL}$ and the green gate voltage $\phi_G$ respectively one transfer clock cycle delayed from the red clear pulse $\phi_{RCL}$ and the red gate voltage $\phi_R$. Further the blue signal charges $Q_B$ are similarly discharged one clock cycle later. Thus the three color signals of one pixel are stored and transferred. By repeating the process, signals corresponding to a picture is sequentially stored and transferred. The charge transfer method from the vertical CCD to the horizontal CCD and within the horizontal CCD is the same as that described before referring to FIGS. 20 and 21.

The third example of the charge transfer operation from the photoelectric converters as shown in FIG. 17 to the vertical CCD is now described.

FIG. 27(a) shows a cross-sectional diagram of the junction. In this example, the charge injection section includes an N⁺ region 124 forming a capacitor (which is a potential well) for storing the logarithmic charges and a gate electrode $E_{TR}$ for transferring the signal charges stored in the capacitor 124 to the vertical CCD. The vertical CCD here uses an N⁻ buried channel 101. The other numerals in the figure denote the same as in FIG. 17. The N⁻ buried channel 101 is made by injecting ions into a P⁻ semiconductor substrate 100. A $SiO_2$ insulation layer is placed on the buried channel 101, and vertical transfer electrodes $E_{11}$, $E_{11}$, ... are formed on the insulation layer. On the transfer electrodes $E_{11}$, $E_{14}$, $E_{17}$, ... is applied the first transfer clock signal $\phi_{V3}$, on the transfer electrodes $E_{12}$, $E_{15}$, $E_{18}$, ... is applied the second clock signal $\phi_{V1}$, and on the transfer electrodes $E_{13}$, $E_{16}$, $E_{19}$, ... is applied the third clock signal $\phi_{V3}$. That is, the vertical CCD of the present example is drive by a three-phase transfer clock signal. This enables to decrease the length of a unit shift register of the vertical CCD compared to the case driven by two- or four-phase signal.

Figure 28:
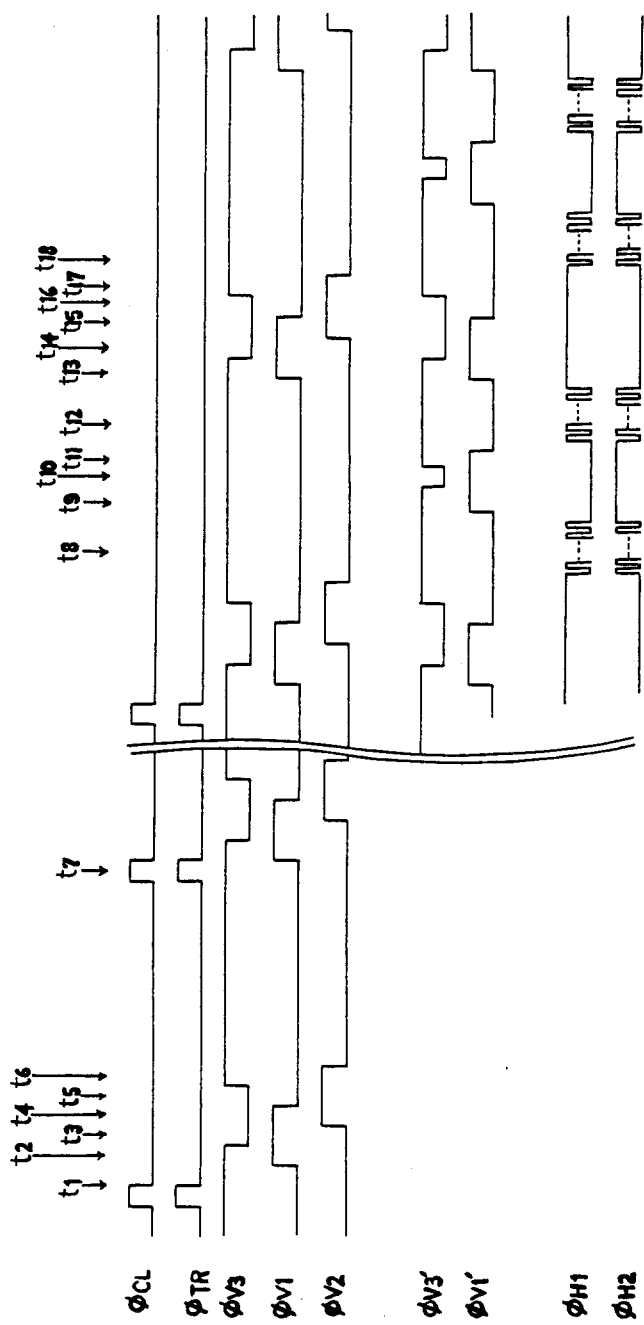
FIG. 28 is a timing chart of the photosensing and charge transfer of the image sensor.

The operation is detailed referring to the timing chart of FIG. 28 and the potential diagrams of FIG. 27(b)–27(h) respectively corresponding to time $t_1$–$t_7$ of FIG. 28.

At time $t_1$, when the gate voltage $\phi_{CL}$ of the reset MOS transistor $TR_O$ turns from high to low, the MOS transistor $TR_O$ turns off and the resetting of the circuit finishes. At the same time, since the voltage $\phi_{TR}$ on the gate electrode $E_{TR}$ turns from high to low raising the potential under the electrode, the logarithmic charge accumulation begins.

At time $t_2$, when the second transfer clock signal $\phi_{V1}$ turns high, the potential under the electrodes $E_{12}$, $E_{15}$, $E_{18}$, ... lowers as shown in FIG. 27(c). The potential at the N⁺ region 124 rises corresponding to the amount of the signal charges.

At time $t_3$, when the first transfer clock signal $\phi_{V3}$ turns low, the potential under the electrodes $E_{11}$, $E_{14}$, $E_{17}$, ... rises as shown in FIG. 27(d). The signal charges in the vertical CCD proceed by the amount equal to one transfer electrode from the time shown by FIG. 27(b). The potential in the N⁺ region further rises and the accumulation continues.

At time $t_4$, when the third transfer clock signal $\phi_{V2}$ turns high, the potential under the electrodes $E_{13}$, $E_{16}$, $E_{19}$, . . . lowers as shown in FIG. 27(e).

At time $t_5$, when the second transfer clock signal $\phi_{V1}$ turns low, the potential under the electrodes $E_{12}$, $E_{15}$, $E_{18}$, . . . rises as shown in FIG. 27(f).

At time $t_6$, when the first transfer clock signal $\phi_{V3}$ turns high, the potential under the electrodes $E_{11}$, $E_{14}$, $E_{17}$, . . . lowers as shown in FIG. 27(g).

At time $t_7$, when the third transfer clock signal $\phi_{V2}$ turns low, the potential under the electrodes $E_{13}$, $E_{16}$, $E_{19}$, . . . rises as shown in FIG. 27(h). This is the end of the charge transfer of one step. At this time, since the voltage $\phi_{TR}$ on the gate electrode $E_{TR}$ turns high, the potential under the electrode $E_{TR}$ lowers and the signal charges stored in the $N^+$ region 124 transfer into the potential well under the transfer electrode $E_{11}$, whereby the charge accumulation stops. At this time, in order to stop the operation of the logarithmic converter, the gate voltage $\phi_{CL}$ of the reset MOS transistor $TR_O$ is turned high to make the transistor $TR_O$ conductive. For effectively performing the operation, it is desirable to equalize the reset voltage and the potential under the gate electrode $E_{TR}$, because the transfer of the stored charges is by itself the resetting of the charge injection section.

Thus the image data of a pixel is stored and transferred. By repeating the operations, image data of a picture is sequentially stored and transferred.

The charge transfer between a vertical CCD V(1) and an element of the horizontal CCD H(1) and within the horizontal CCD H(1) is then explained.

FIG. 29(a) and FIG. 30(a) both show cross-sectional diagram at the junction of a vertical CCD V(1) and the horizontal CCD H(1), where $E_{301}$, $E_{302}$, . . . , $E_3'$, $E_1'$ are transfer electrodes at the end of the vertical CCD V(1). The transfer electrodes $E_{301}$, $E_{302}$ is applied the first transfer clock signal $\phi_{V3}$, the transfer electrodes $E_{101}$, $E_{102}$ is applied the second clock signal $\phi_{V1}$, the transfer electrodes $E_{201}$, $E_{202}$ is applied the third clock signal $\phi_{V3}$, the transfer electrode $E_3'$ is applied the fourth clock signal $\phi_{V3}'$, and the transfer electrode $E_1'$ is applied the fifth clock signal $\phi_{V1}'$. $E_{Hn1}$ is an electrode of a shift register of the horizontal CCD H(1) on which the first transfer clock signal $\phi_{H1}$ is applied, and $E_{Hn2}$ is the other electrode of the horizontal CCD H(1) on which the second transfer clock signal $\phi_{HS}$ is applied.

In the timing chart of FIG. 28, $t_8$ is the time when the image data of all pixels of a picture are obtained. The potential states at time $t_8$ are as shown in FIG. 29(b) and FIG. 30(b).

At time $t_9$, the fifth vertical transfer clock signal $\phi_{V1}'$ turns high and the potential under the transfer electrode $E_1'$ lowers. Since the first horizontal transfer clock signal $\phi_{H1}$ is low, the potential under the electrode $E_{Hn1}$ is higher than those under the vertical transfer electrodes $E_3'$ and $E_1'$, whereby the signal charges in the potential well under the electrodes $E_3'$ and $E_1'$ do not move but rest there. This is shown in FIG. 29(c). Since the second horizontal transfer clock signal $\phi_{H2}$ is high at this time, the potential under the electrode $E_{Hn2}$ is lower than those under the vertical transfer electrodes $E_3'$ and $E_1'$, whereby the signal charges in the potential well under the electrodes $E_3'$ and $E_1'$ are transferred to the potential well under the electrode $E_{Hn2}$. This is shown in FIG. 30(c).

At time $t_{10}$, the fourth vertical transfer clock signal $\phi_{V3}'$ turns low and the potential under the electrode $E_3'$ rises, which is shown in FIG. 29(d) and FIG. 30(d).

At time $t_{11}$, the fourth vertical transfer clock signal $\phi_{V3}'$ turns high and the potential under the electrode $E_3'$ lowers, which is shown in FIG. 29(e) and FIG. 30(e).

At time $t_{12}$, the fifth vertical transfer clock signal $\phi_{V1}'$ turns low and the potential under the electrode $E_1'$ rises, which prevents charge backflow from the horizontal CCD. At this time, the first and the second horizontal transfer clock signals $\phi_{H1}$ and $\phi_{H2}$ change high and low at a high pitch to read out all the signal charges transferred there at time $t_9$. The potential state is shown in FIG. 29(f) and FIG. 30(f).

At time $t_{13}$, the second vertical transfer clock signal $\phi_{V1}$ turns high and the fifth transfer signal $\phi_{V1}'$ turns low, which lowers the potential under the transfer electrodes $E_{101}$, $E_{102}$ and $E_1'$. Since the second transfer signal $\phi_{V1}$ is high this time, the potential under the electrode $E_{Hn1}$ becomes lower than those under the transfer electrodes $E_3'$ and $E_1'$, whereby the signal charges in the potential well under the electrodes $E_3'$ and $E_1'$ transfer to the well under the electrode $E_{Hn1}$. This is shown by FIG. 29(g). As for the electrode $E_{Hn2}$, the charges under the electrodes $E_3'$ and $E_1'$ have already been transferred and there is no charges there. Even if there exist the charges, since the transfer clock signal $\phi_{H2}$ is low at this time, the potential under the electrode $E_{Hn2}$ is higher than those under the electrodes $E_3'$ and $E_1'$, so the charge transfer is impossible. The potential state is shown in FIG. 30(g).

At time $t_{14}$, the first and fourth vertical transfer clock signals $\phi_{V3}$ and $\phi_{V3}'$ turns low, which raises the potential under the transfer electrodes $E_{301}$, $E_{302}$ and $E_3'$, as shown in FIG. 29(h) and FIG. 30(h). This time $t_{14}$ follows the time $t_8$ by the amount corresponding to one transfer electrode.

At time $t_{15}$, the third vertical transfer clock signal $\phi_{V2}$ turns high, which lowers the potential under the transfer electrodes $E_{201}$, $E_{202}$, as shown in FIG. 29(i) and FIG. 30(i).

At time $t_{16}$, the second and fifth vertical transfer clock signals $\phi_{V1}$ and $\phi_{V1}'$ turns low, which raises the potential under the transfer electrodes $E_{101}$, $E_{102}$ and $E_1'$, as shown in FIG. 29(j) and FIG. 30(j). This time $t_{16}$ follows the time $t_8$ by the amount corresponding to tow transfer electrodes.

At time $t_{17}$, the first and fourth vertical transfer clock signals $\phi_{V3}$ and $\phi_{V3}'$ turns high, which raises the potential under the transfer electrodes $E_{201}$, $E_{202}$, as shown in FIG. 29(k) and FIG. 30(k).

At time $t_{18}$, the third vertical transfer clock signal $\phi_{V2}$ turns low, which raises the potential under the transfer electrodes $E_{201}$, $E_{202}$, as shown in FIG. 29(l) and FIG. 30(l). This time $t_{18}$ follows the time $t_8$ by the amount corresponding to three transfer electrodes, i.e. one bit of the horizontal shift register.

Thus the signal charges in lines of odd numbers and in lines of even numbers are alternately transferred to the horizontal CCD H(1) and then read out from the terminal of the horizontal CCD H(1). In this case, one transfer electrode in the horizontal CCD H(1) corresponds to one vertical CCD, which enables decrease of the horizontal pixel pitch.

Figure 31:
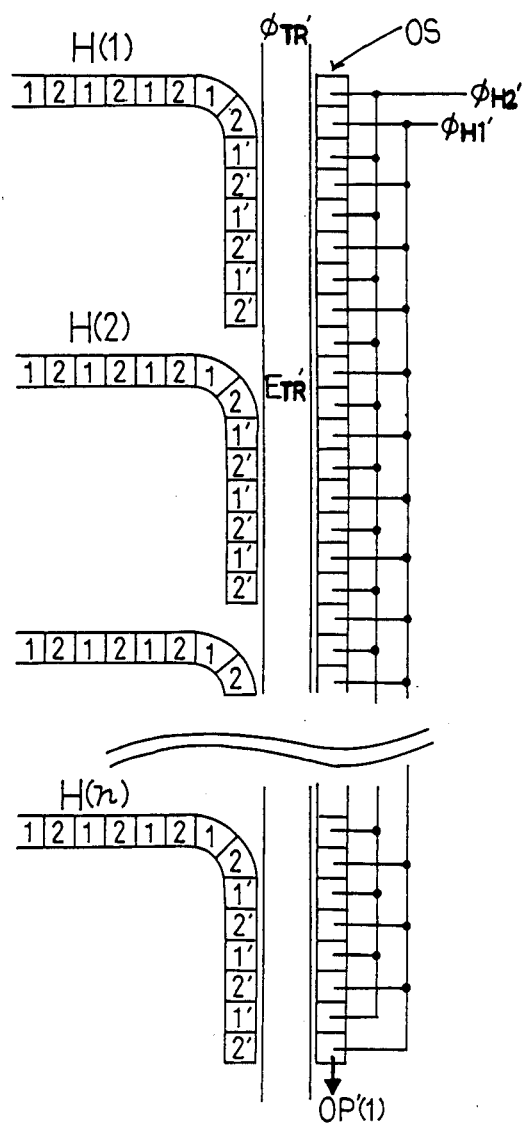
FIG. 31 is a plan view of the terminal part of the horizontal CCDs and an output selection CCD.

FIG. 31 shows a structure where an output selection CCD is provided to unite several analogue output lines. In FIG. 31, H(1), H(2), . . . , H(n) denote horizontal CCDs, OS is the output selection CCD, $E_{TR}'$ is a polysilicon electrode for the gate between the horizontal CCDs and the output selection CCD, OP'(1) is the output, numerals 1, 2, 1' and 2' denote transfer electrodes of the horizontal CCDs respectively receiving the horizontal transfer clock signals $\phi_{H1}$ and $\phi_{H2}$. When the first signal charges in the horizontal CCDs H(1), H(2), ..., H(n) arrive at the terminal electrodes 2' of each horizontal CCD, the clock voltage on the gate electrode $E_{TR}'$ turns high to lower the potential under it. By turning the potential $\phi_{H1}'$ on the corresponding electrodes of the output selection CCD OS high, the signal charges under the terminal electrodes 2' of the horizontal CCDs H(1), H(2), ..., H(n) transfer to the output selection CCD OS. Then the signal charges are read out from the output selection CCD OS. The same operations are repeated thereafter. In this case, only the charges under the electrodes 2' are transferred but those under the electrodes 2 remain. While the signal charges in the output selection CCD OS are read out, following signal charges are being transferred in the horizontal CCDs H(1), H(2), ..., H(n).

Obviously, many modifications and variations of the present invention are possible in light of the above teachings. It is therefore to be understood that within the scope of the appended claims, the invention may be practiced other than as specifically described.

What is claimed is:

1. An image sensor including a plurality of photosensors integrated on a semiconductor substrate, each photosensor comprising:
    a photoreceptor for receiving light and generating source electrical charges corresponding to the amount of the received light; and
    a logarithmic converter for receiving the source electrical charges and for generating signal electrical charges whose amount is logarithmically proportional to the source electrical charges, the logarithmic converter comprising first and second PN junctions, the first PN junction connected in parallel to the second PN junction, and a capacitor connected in series to the second PN junction.

2. An image sensor, as in claim 1, where:
    the first and second PN junctions are respectively formed by a first and second N-type semiconductor regions separately embedded in a P-type semiconductor region;
    the capacitor is a MOS capacitor formed by an electrode placed on the second N-type semiconductor region via an insulation layer; and
    a gate is formed by an electrode placed on the region of the P-type semiconductor that is between the first and second N-type semiconductor regions via an insulation layer, whereby a MOS transistor is formed by the first and second N-type semiconductor regions, P-type semiconductor region and the gate for controlling the discharging of signal charges in the capacitor.

3. An image sensor, as in claim 2, where the N-type and P-type semiconductor regions are reversed.

4. An image sensor, as in claim 1, where the image sensor further comprises on the semiconductor substrate a plurality of charge coupled devices each for storing and transferring the signal electrical charges.

5. A photosensor integrated on a semiconductor substrate comprising:
    a photoelectric converter having
        a photoreceptor for receiving light and generating source electrical charges corresponding to the amount of the received light and
        a logarithmic converter, connected to the photoreceptor, including a first and a second PN junctions, the first PN junction connected in parallel to the second PN junction, and a capacitor connected in series to the second PN junction, the logarithmic converter receiving the source electrical charges and generating signal electrical charges whose amount is logarithmically proportional to the source electrical charges; and
    a charge coupled device for storing and transferring the signal electrical charges, the capacitance of a charge storage of the charge coupled device acting as the capacitor.

6. A photosensor, as in claim 5, where where the capacitor consists of:
    a $P^+$-type semiconductor region placed on an $N^-$-type substrate,
    an $N^-$-type semiconductor region, placed on the $P^-$-type semiconductor region, forming a buried channel of the charge coupled device,
    an $N^+$-type semiconductor region embedded in the $N^-$-type semiconductor region,
    an insulation layer placed on the $N^+$-type semiconductor region and
    a storage electrode placed on the insulation layer.

* * * * *